(12) United States Patent
Slessman

(10) Patent No.: US 10,244,663 B2
(45) Date of Patent: Mar. 26, 2019

(54) APPARATUS AND METHOD FOR REGULATING ENVIRONMENTAL CONDITIONS ASSOCIATED WITH EQUIPMENT

(75) Inventor: George Slessman, Scottsdale, AZ (US)

(73) Assignee: BASELAYER TECHNOLOGY, LLC, Chandler, AZ (US)

( * ) Notice: Subject to any disclaimer, the term of this patent is extended or adjusted under 35 U.S.C. 154(b) by 2252 days.

(21) Appl. No.: 12/837,233

(22) Filed: Jul. 15, 2010

(65) Prior Publication Data
US 2012/0014061 A1 Jan. 19, 2012

(51) Int. Cl.
H05K 7/20 (2006.01)
(52) U.S. Cl.
CPC ..... H05K 7/20745 (2013.01); H05K 7/20836 (2013.01)
(58) Field of Classification Search
CPC .... F24F 3/04; F24F 3/14; F24F 11/022; F24F 11/0012; F24F 11/0015; F24F 2003/144; F24F 2011/0042; G05D 22/00; H05K 7/20745; H05K 7/20836
USPC ........ 62/259.2, 263, 186, 176.1, 176.6, 180; 236/44 A, 44 C, 49.3
See application file for complete search history.

(56) References Cited

U.S. PATENT DOCUMENTS

| | | | | |
|---|---|---|---|---|
| 6,034,873 A * | 3/2000 | Stahl | ................ | H05K 7/20745 165/80.3 |
| 8,184,435 B2 * | 5/2012 | Bean, Jr. | ............ | H05K 7/20745 165/104.33 |
| 2003/0000154 A1 * | 1/2003 | Ignazio | ................... | B60J 7/026 52/66 |
| 2004/0141542 A1 * | 7/2004 | Sharma | .................... | G01K 7/42 374/141 |
| 2005/0224196 A1 * | 10/2005 | Rasmussen | ............... | E06B 9/50 160/323.1 |
| 2005/0237716 A1 * | 10/2005 | Chu | .................. | H05K 7/20745 361/696 |
| 2006/0042287 A1 * | 3/2006 | Nyheim | ................ | A47F 3/0443 62/246 |
| 2006/0260338 A1 * | 11/2006 | VanGilder | .......... | H05K 7/20745 62/259.2 |
| 2007/0064391 A1 * | 3/2007 | Lewis, II | ........... | H05K 7/20736 361/695 |
| 2007/0281639 A1 * | 12/2007 | Clidaras | .................... | G06F 1/20 455/128 |
| 2008/0291626 A1 * | 11/2008 | Nelson | .................. | F24F 1/0059 361/696 |
| 2009/0168345 A1 * | 7/2009 | Martini | ................ | F24F 11/0001 361/691 |

(Continued)

Primary Examiner — Kun Kai Ma
(74) Attorney, Agent, or Firm — LKGlobal | Lorenz & Kopf, LLP

(57) ABSTRACT

A thermal cage for managing environmental conditions affecting electronic equipment. The thermal cage can be connectable with a plenum and a supply channel. Additionally, the thermal cage can include a cabinet faulting an enclosure for the electronic equipment and an outlet in fluid communication with the cabinet, wherein the outlet is connectable to the plenum. Furthermore, the thermal cage can include an inlet in fluid communication with the cabinet, wherein the inlet is connectable to the supply channel, and a thermal curtain comprising a plurality of adjustable barriers for directing air flowing through the cabinet to the outlet, wherein the thermal cage is movable.

20 Claims, 10 Drawing Sheets

(56) References Cited

U.S. PATENT DOCUMENTS

| | | | |
|---|---|---|---|
| 2009/0173017 A1* | 7/2009 | Hall | H05K 7/20745 52/69 |
| 2010/0108272 A1* | 5/2010 | Karidis | E06B 9/42 160/238 |
| 2010/0230058 A1* | 9/2010 | Mahoney | E04H 1/1238 160/331 |
| 2010/0315775 A1* | 12/2010 | Grantham | H05K 7/20745 361/688 |
| 2011/0108207 A1* | 5/2011 | Mainers | H05K 7/20745 160/87 |
| 2013/0058029 A1* | 3/2013 | Ootani | H05K 7/20745 361/679.31 |
| 2013/0235519 A1* | 9/2013 | Miyauchi | H05K 7/20745 361/679.46 |
| 2013/0276389 A1* | 10/2013 | Marrs | A62C 35/00 52/173.1 |

* cited by examiner

400

500

600

700

Side View
800

900

APPARATUS AND METHOD FOR REGULATING ENVIRONMENTAL CONDITIONS ASSOCIATED WITH EQUIPMENT

CROSS-REFERENCES TO RELATED APPLICATIONS

This application is related to co-pending U.S. patent application Ser. No. 12/626,278 entitled "System And Method Of Providing Computer Resources", U.S. patent application Ser. No. 12/626,299 entitled "Apparatus and Method of Environmental Condition Management for Electronic Equipment" and U.S. patent application Ser. No. 12/626,299 entitled "Apparatus and Method for Regulating Various Conditions Affecting Electronic Equipment" filed contemporaneously herewith, the disclosures of which are hereby incorporated by reference in their entirety.

FIELD OF THE INVENTION

The present application relates to the management of environmental conditions associated with electronic equipment, and particularly to a system for regulating environmental conditions affecting equipment.

BACKGROUND

Currently, a variety of different environmental conditions can affect or damage electronic equipment and thereby cause tremendous expense, inconvenience, and a decrease in efficiency. For example, fluctuations in temperature, pressure, humidity, and other conditions can cause the electronic equipment to function abnormally, sustain damage, or be rendered inoperable. Different types of electronic equipment can have varying ranges of environmental conditions at which they are able to operate properly. As an illustration, some servers have a maximum allowed temperature range of between 59 to 90 degrees Fahrenheit, while having an optimal performance range between 68 and 77 degrees Fahrenheit. If the temperature falls outside the maximum allowed temperature range, it can cause the servers to malfunction.

Thus, a variety of solutions have been created in order to effectively regulate the conditions affecting electronic equipment. Such solutions can include, for example, providing air conditioning, fire protection and prevention systems, and other similar means for controlling environmental conditions. One of the most common configurations involves using data centers, which include cabinets for storing servers or other electronic equipment mounted in rows within in the cabinet. However, the processors and other hardware contained within the servers or other electronic equipment are frequently exposed to detrimental environmental conditions such as overheating or humidity. If the temperature and/or other environmental conditions are not effectively controlled, those relying on the servers for effective communications can experience interruptions in service.

In order to effectively control the environmental conditions, it often involves having to use a powerful air conditioning units and/or a significant number of fans to generate continuous air flow across the electronic equipment to keep the environmental conditions in allowable ranges. Additionally, raised floor subsystems are often utilized to channel cool air through inlets in the cabinets so as to cool the electronic equipment. Although such solutions provide a means for regulating the environmental conditions, there is often a tremendous expense with having to construct such systems at each location where electronic equipment is housed. Furthermore, certain configurations for housing the equipment at some locations may be entirely different and/or not be readily compatible with configurations at other locations. This further increases costs and inconvenience. As more different and powerful technologies come into existence and users' performance expectations increase, it becomes even more important to effectively regulate environmental conditions affecting such technologies.

SUMMARY

In accordance with one aspect of the exemplary embodiments, a thermal cage for managing environmental conditions affecting electronic equipment can be provided. The thermal cage can be connectable with a plenum and a supply channel and the thermal cage can include a cabinet forming an enclosure for the electronic equipment. Additionally, the thermal cage can include an outlet and an inlet in fluid communication with the cabinet, wherein the outlet is connectable to the plenum, and wherein the inlet is connectable to the supply channel. The thermal cage can also include a thermal curtain comprising a plurality of adjustable barriers for directing air flowing through the cabinet to the outlet, wherein the thermal cage is movable.

In accordance with another exemplary embodiment, a method can include, but is not limited to including, the steps of: providing a movable thermal cage for managing environmental conditions affecting electronic equipment, wherein the thermal cage comprises a cabinet forming an enclosure for the electronic equipment, and a thermal curtain comprising one or more adjustable barriers for directing air flowing through the cabinet to a plenum; positioning the movable thermal cage in a facility having at least one of a drop ceiling grid associated with the plenum and a raised floor system associated with a supply channel for providing temperature-regulated air to the cabinet; and connecting the thermal cage to at least one of the drop ceiling grid and the raised floor system.

In accordance with another exemplary embodiment, a thermal cage for electronic equipment can be provided. Notably, the thermal cage can include a plenum in fluid communication with an exhaust channel and a supply channel, wherein the plenum is adapted to direct air to the supply channel. The thermal cage can also include a cabinet forming an enclosure for the electronic equipment, wherein the cabinet is in fluid communication with the exhaust channel and the supply channel. Additionally, the thermal cage can include a raised floor system associated with the supply channel, wherein temperature-regulated air is supplied by the raised floor system to the cabinet via an inlet. Moreover, the thermal cage can include a thermal curtain comprising a plurality of adjustable barriers for directing air flowing through the cabinet to an outlet in fluid communication with the cabinet and the plenum, wherein the thermal cage is movable.

The above-described and other features and advantages of the present disclosure will be appreciated and understood by those skilled in the art from the following detailed description, drawings, and appended claims.

DETAILED DESCRIPTION OF THE INVENTION

The exemplary embodiments of the present disclosure are described with respect to a thermal cage and accompanying thermal management system for controlling environmental conditions affecting electronic equipment. The exemplary embodiments can allow for a modular configuration of a facility or a portion thereof, which provides thermal management to various electronic equipment. It should be understood by one of ordinary skill in the art that the exemplary embodiments of the present disclosure can be applied to other types of thermal management systems. Additionally, features of the exemplary embodiments can be used with each other and/or with alternative features that are not shown.

Figure 1:
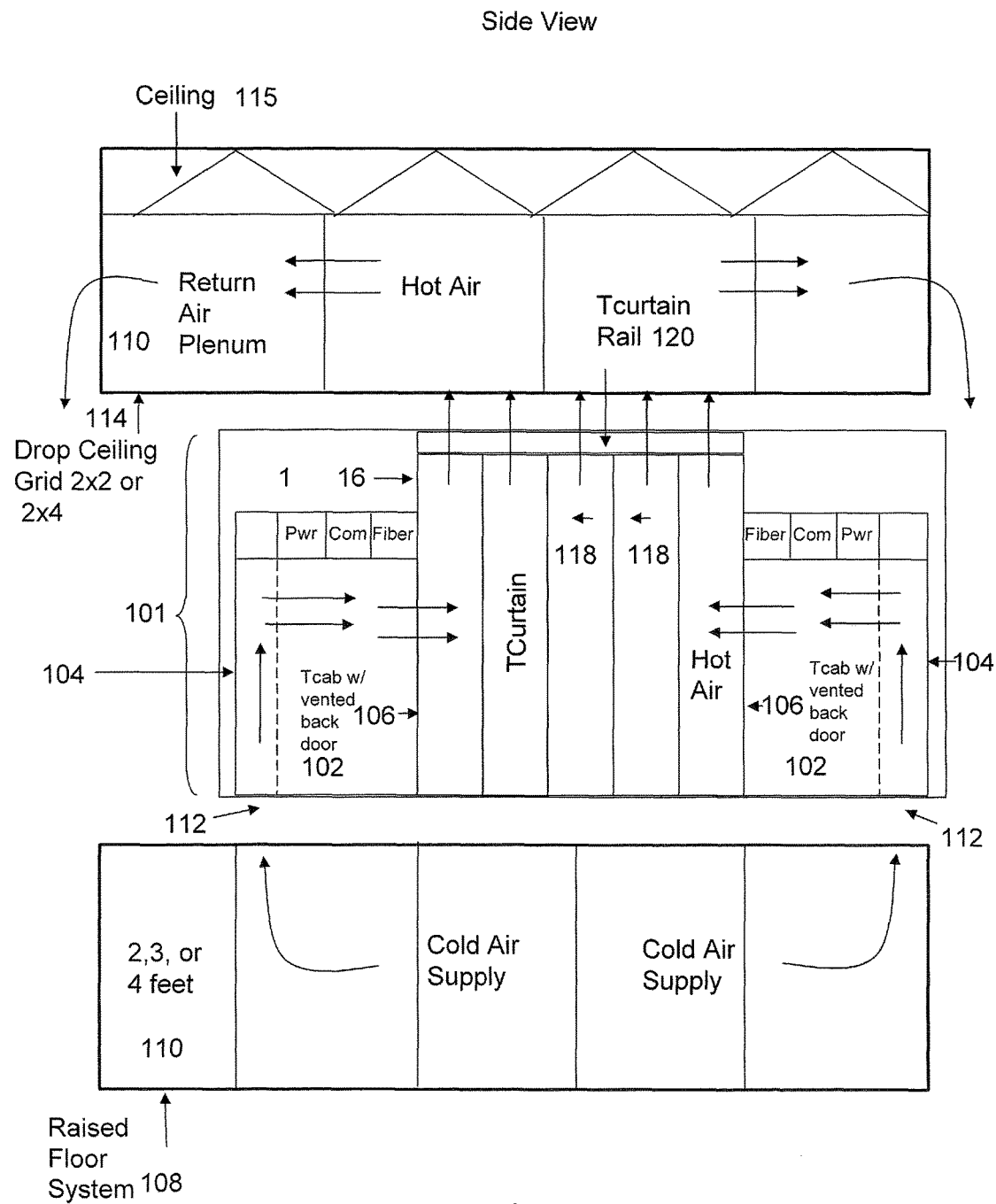
FIG. 1 illustrates a thermal management system for managing environmental conditions affecting electronic equipment, which according to an exemplary embodiment, includes a thermal cage, a pair of thermal cabinets, and a thermal curtain for directing air heated by the electronic equipment contained in the cabinets.

Referring to the drawings and in particular FIG. 1, an exemplary embodiment of a thermal management system 100 for controlling environmental conditions is illustrated. The thermal management system 100 can include a thermal cage 101, which can be utilized to house one or more cabinets 102 and electronic equipment. Notably, the cabinets 102 can be utilized to form an enclosure for the electronic equipment. The thermal cage 101 can be made out of steel-mesh, chain-link, metals, plastics, or other materials. The thermal cage 101 can be designed to have varying proportions, sizes, and features based on desired specifications. Additionally, the thermal cage 101 can include an inlet and an outlet (not explicitly shown), which can be in fluid communication with the cabinets 102. The inlet of the thermal cage 101 can be connectable to a supply channel for supplying cool air to the cabinets 102. In an embodiment, the inlet can be a flexible, rigid, or semi-rigid conduit that can be connected to the supply channel. The outlet of the thermal cage 101 can be connectable to a plenum, such as through a drop ceiling grid. Much like the inlet, the outlet of the thermal cage 101 can be a flexible, rigid, or semi-rigid conduit that can be connected to a plenum inlet of a plenum. The conduits can be made of plastic, metal, or other materials suitable for conduits.

In an embodiment, the thermal cage 101 can be configured to be movable such as through the use of strategically positioned wheels, roller mechanisms, or other mechanisms for allowing the thermal cage 101 to be moved from one location to another with relative ease. For example, wheels and/or roller mechanisms can be positioned underneath the thermal cage 101 so as to allow a technician to move the thermal cage 101 by pushing or pulling the thermal cage 101. The thermal cage 101 can also include components that can enable a forklift or other vehicle to easily lift, move and/or transport the cage 101 to another location. In another embodiment, the thermal cage 101 can include handles or other holding mechanisms for allowing the technician to push or pull the cage 101. In yet another embodiment, the thermal cage 101 can be configured to include one or more access doors. The access doors can allow a technician or other authorized personnel to access the space and electronic equipment within the thermal cage 101.

In one embodiment, the access doors and the thermal cage 101 itself can be protected from access through the use of biometric sensing devices such as iris scanners and fingerprint scanners. For example, the thermal cage 101 can include a fingerprint scanner, which can store fingerprints of authorized personnel in a memory location of the fingerprint scanner. Authorized personnel can place a finger on the scanner and if the scanner finds the fingerprint in memory or otherwise validates the fingerprint, the scanner can allow the person to access the interior of the thermal cage 101. As an illustration, if the scanner determines that the person is an authorized user, the scanner can unlock an access door or otherwise provide access to the person. If the scanner determines that the person is unauthorized, the scanner can deny access to the person and/or transmit a warning signal to authorized personnel. The warning signal can indicate that an unauthorized user is attempting to access the thermal cage 101. Also, an auditory and/or visual indicator can be outputted to the person attempting to gain access to the thermal cage 101. For example, the auditory and/or visual indicator can indicate a successful or unsuccessful attempt.

In another embodiment, the thermal cage 101 can be configured to include or be connectable to a mantrap. The mantrap, for example, can be a small space, which can include a pair of interlocking doors. The first pair of interlocking doors can be configured to close before the second set of doors is allowed to open. Each pair of doors can include different access mechanisms, which can include, but not are not limited to including, biometric sensing devices, radio-frequency identification devices, keypad mechanisms, key and lock mechanisms, or other access mechanisms. As an illustration, the first set of doors can have a key lock, but the second set of doors can have a fingerprint scanner or radio-frequency identification access mechanism. If an intruder is able to pass the first set of doors by using the key, but is not authorized to pass through the second set of doors, the intruder can be trapped between the doors. The exemplary embodiments contemplate the use of other components and/or techniques for implementing the mantrap.

Furthermore, in one embodiment, the thermal cage 101 can include or be connected to a surveillance system. The surveillance system can include a closed-circuit television system, which can include video cameras, audio detection devices, and/or other surveillances devices for monitoring the thermal cage 101 and the area surrounding the thermal cage 101. Surveillance footage and audio can be transmitted to technicians or other authorized personnel for review. Additionally, the thermal cage 101 can include or be connected to one or more motion detectors, which can transmit signals to technicians or sound off alarms if motion is detected.

As mentioned above, the thermal cage 101 can contain one or more cabinets 102 for storing various types of electronic equipment. The cabinets 102 can be utilized to store various types of equipment, such as, but not limited to, servers, computers, storage devices, telecommunications devices, and other devices. The cabinets 102 can be arranged into a variety of configurations based on preferences. For example, as shown in FIG. 1, the cabinets 102 are arranged in the thermal cage 101 in two rows with the backs of the cabinets 102 facing each other. Of course, other ways of arranging the cabinets 102 can be utilized as well. The cabinets 102 can be configured to contain one or more rows for storing the electronic equipment, which can be adjusted to different positions so as to accommodate varying types of equipment or preferences. For example, some devices which do not generate much heat may be allowed to be packed more closely in the cabinets 102 than devices which generate more heat.

Notably, the cabinets 102 can contain a top, bottom, and side walls, and can be accessed in the front via front doors 104 and accessed in the back by rear doors 106. The rear doors 106 can be vented so as to allow air to flow out of the cabinets 102. By venting the rear doors 106 and allowing the air to flow out of the cabinets 102, air that is heated by the electronic equipment in the cabinets 102 can escape and thereby prevent rapid overheating. In one embodiment, the cabinets 102 can include fans or other flow control devices to facilitate movement of the air into and out of the cabinets. In another embodiment, vents can be placed along other parts of the cabinets 102 such as the top and side walls.

The thermal management system 100 can also include a raised floor system 108. In an embodiment, the thermal cage 101 can be connected to the raised floor system 108, which can reside below the cabinets 102, such as shown in FIG. 1. The thermal cage 101 can be positioned over the raised floor system 108 and fasteners, clasps, or other connecting mechanisms of the thermal cage 101 can be utilized to attach the thermal cage 101 to the raised floor system 108. In an embodiment, the thermal cage 101 can be connected to the raised floor system 108 by utilizing the inlet conduit described above. The inlet conduits would not only serve to connect the thermal cage 101 to the raised floor system 108, but could also be used to channel air flowing from the raised floor system 108 to the various components inside the thermal cage 101. The raised floor system 108 can be a false floor, which resides on top of an actual floor. Dimensions for the raised floor system 108 can, for example, be two, three or four feet for each section in the floor system 108. The raised floor system 108 can also include a cooling coil (not explicitly shown) and/or one or more plenums 110. The plenums 110 can include pressure sources for causing a pressure differential to cause air to flow through the raised floor system 108, and the cooling coil can be utilized to cool the air as it reaches the coil. Cooled air can flow through the raised floor system 108, which can then be fed to the cabinets 102 via openings 112 at the bottom of the cabinets.

Additionally, the thermal management system 100 can also include a drop ceiling grid 114, which can be a false ceiling which can be positioned below an actual ceiling 115. The thermal cage 101 can be positioned under the drop ceiling grid 114 and much like as described for the raised floor system 108, fasteners, clasps, or other attaching mechanisms of the thermal cage 101 can be used to connect the thermal cage 101 to the drop ceiling grid 114. in an embodiment, the outlet conduits described above can be utilized to connect the thermal cage 101 to the drop ceiling grid 114. The outlet conduits can be utilized not only to connect the thermal cage 101 to the drop ceiling grid 114, but can also be used to channel hot air flowing out of the cabinets 102 and the thermal cage 101 into the drop ceiling grid 114. The drop ceiling grid 114 can be divided into sections of various dimensions. For example, the sections can have measurements of two feet by four feet or two feet by two feet. The drop ceiling grid 114 can include one or more plenums 110, much like the raised floor system 108. The plenums 110 in the drop ceiling grid 114 can be utilized to direct air flow, such as hot air flow from the cabinets 102, to the raised floor system 108 or other areas for cooling.

The thermal management system 100 can further include a thermal curtain 116, which can be utilized to direct hot air flowing from the rear doors 104 of the cabinets 102. The thermal curtain 116 can be integrated into the thermal cage 101 such as by connecting the thermal curtain 116 just underneath the top of the cage 101. The thermal curtain 116, for example, can direct hot air to the drop ceiling grid 114. Plenums 110 in the drop ceiling grid 114 can direct the hot air to cooling coils for cooling the hot air, which can then be supplied to the cabinets 102 via the raised floor system 108. Notably, the thermal curtain 116 can be comprised of a plurality of flexible barriers 118 and can be made of materials such as plastic or other similar materials. The flexibility of the barriers 118 can allow technicians to readily walk through the barriers 118, particularly at the ends of the thermal curtain 116 in order to access various portions of the cabinets 102. Additionally, the barriers 118 of the thermal curtain 116 can be configured to be transparent or clear, so that a technician or other individual can easily see anything beyond the curtain barriers 118. The degree of transparency can vary according to a number of factors including the particular components that are obstructed by the barriers 118.

In an embodiment, the thermal curtain 116 can be connected to the thermal cage 101 through the use of a rail 120. In another embodiment, the rail 120 can include rivets and can allow the thermal cage 101 and thermal curtain 116 to be connected to the drop ceiling grid 114. The rivets can be utilized to hold the barriers 118 of the thermal curtain 116. As shown in FIG. 1, the thermal cage 101, the cabinets 102, the thermal curtain 116; and the rail 120 can exist as one integrated movable unit, which can be connected to various raised floor systems, drop grid ceilings, mantraps, surveillance systems, and other components. As a result, the integrated thermal cage 101 can be easily transported and attached to components at other locations.

Figure 2:
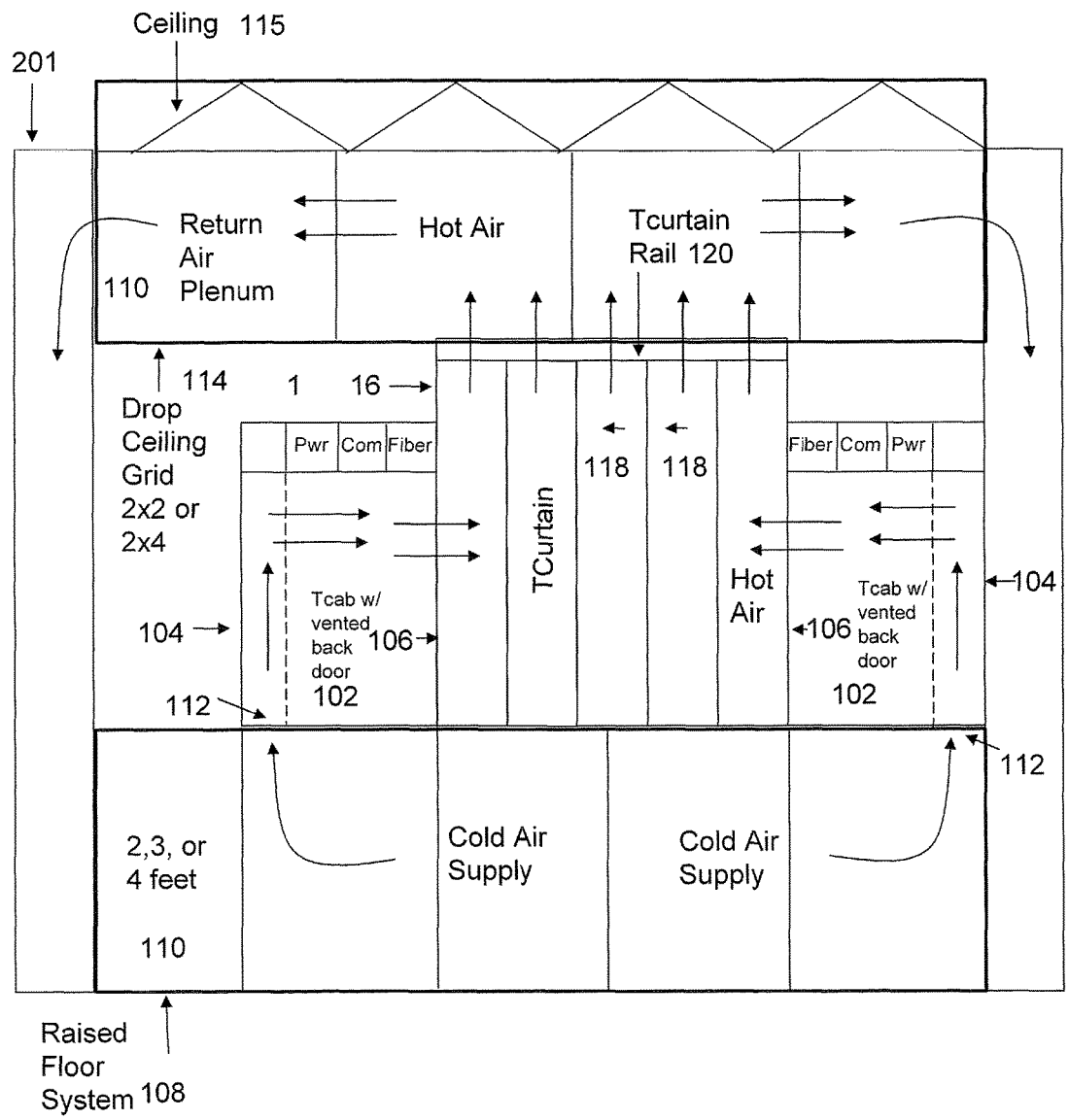
FIG. 2 illustrates a thermal management system comprising a thermal cage, which according to another exemplary embodiment, includes thermal cabinets, a thermal curtain, a raised floor system, and a drop grid ceiling.

Referring now also to FIG. 2, an exemplary embodiment a thermal management system 200 is illustratively shown. Much like thermal management system 100, thermal management system 200 features many of the same components, which are indicated by the common reference numerals. However, thermal management system 200 features a different thermal cage 201. In one embodiment, thermal cage 201 can integrate not only cabinets 102, thermal curtain 116, and/or rail 120 as in thermal cage 101, but can also integrate the raised floor system 108 and the drop ceiling grid 114 into the thermal cage 201. Accordingly, thermal cage 201 and its accompanying integrated components can exist as a movable unit, which can be connected to other devices and components. In an embodiment, the thermal cage 201 along with the integrated raised floor system 108, drop grid ceiling 114, cabinets 102, thermal curtain 116, and rail 120 can be transported to various locations. In another embodiment, thermal cage 201 can be connected to a controller for adjusting environmental conditions associated with the thermal cage 201.

Additionally, the thermal cage 201 can be connected to a chiller for chilling water or other fluids which can be utilized by a cooling coil to cool air to be supplied to the thermal cage 201. In an embodiment, the thermal cage 201 can also be connected to a communications network, such as, but not limited to, a cable network, wireless network, or satellite network. The cage 201 can, in another embodiment, be connected to one or more power sources. For example, the power sources can include electrical outlets, batteries, generators, or other power sources. The power sources can be utilized to power any of the components of the thermal cage 201, cabinets 102, and/or the electronic equipment. As described above for thermal cage 101, thermal cage 201 can also be connected to biometric devices, mantraps, surveillance systems, and other systems. Thermal cage 201 can also include means for actuating or allowing a technician to adjust one or more positions and/or the length of the barriers 118 of the thermal curtain 116.

Figure 3:
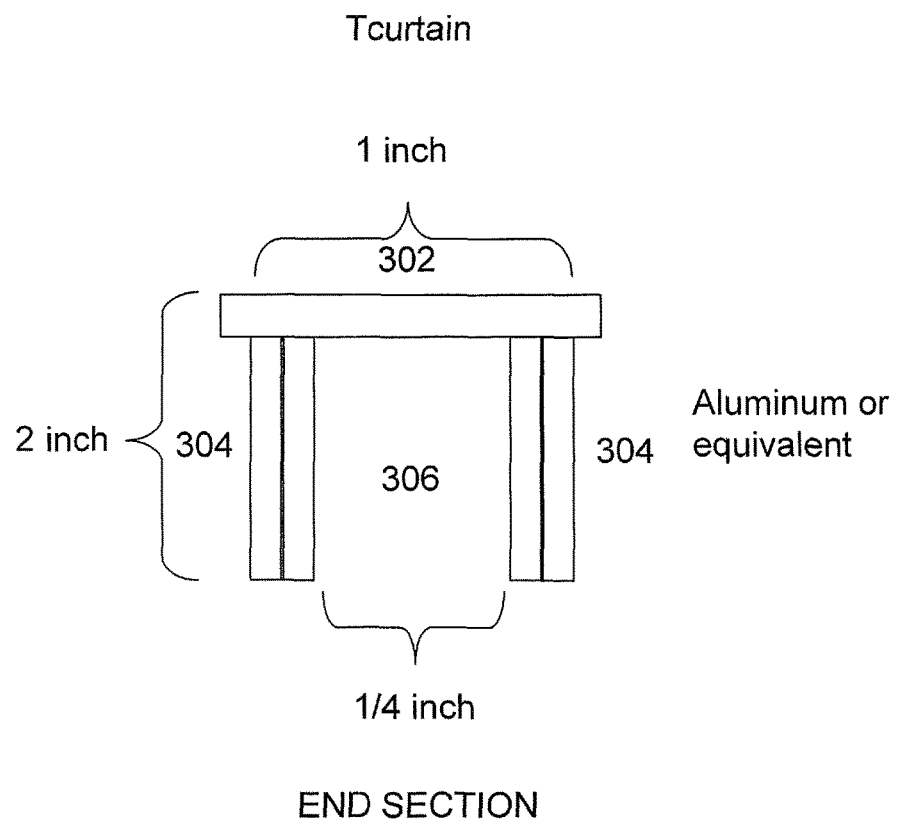
FIG. 3 illustrates an exemplary embodiment of a device for holding a barrier that is utilized in forming a thermal curtain.

Referring now also to FIG. 3, an end section 300 for holding a barrier 118 of the thermal curtain 116, is illustratively shown. The end section 300 can have varying dimensions, which, in this case is one inch across the top 302 of the end section 300 and two inches down the vertical sections 304 of the end section 300. The space 306 between the vertical sections of the end section 300 can be one fourth of an inch. Of course, the provided dimensions are for illustration only and the dimensions can be adjusted based on the circumstances. Notably, the end section 300 itself can be made of aluminum or other similar materials.

Figure 4:
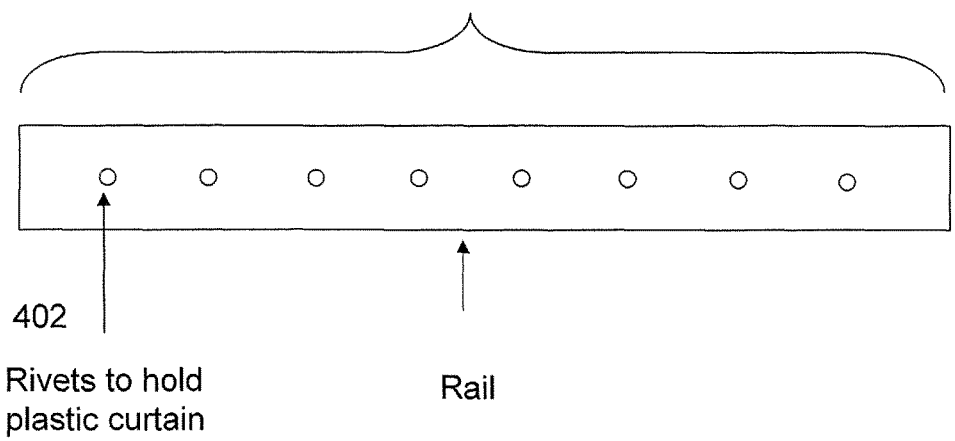
FIG. 4 illustrates an exemplary embodiment of a rail which can be utilized to hold a thermal curtain and connect the thermal curtain to a drop ceiling grid.

Referring now also to FIG. 4, a rail 400 is shown which can be utilized to hold the barriers 118 of the thermal curtain 116 and connect the thermal curtain 116 to the drop ceiling grid 114. Additionally, the rail 400 can be utilized to connect the thermal curtain to the thermal cages 101 or 201. The rail 400 features a plurality of rivets 402, which can be utilized to hook the thermal curtain 116 to the rail 400. Although, the present disclosure contemplates using other connection structures. In an embodiment, the spacing of the rivets 402 can be adjusted based on the size of the barriers 118 or for other reasons as well. Additionally, the rail 400 can be configured to come in a variety of different dimensions. For example, in this case, the rail 400 can come in lengths of 3, 6, 9, 12, and 15 feet. Other lengths and/or dimensions of the rail 400 can be utilized depending on the circumstances.

Figure 5:
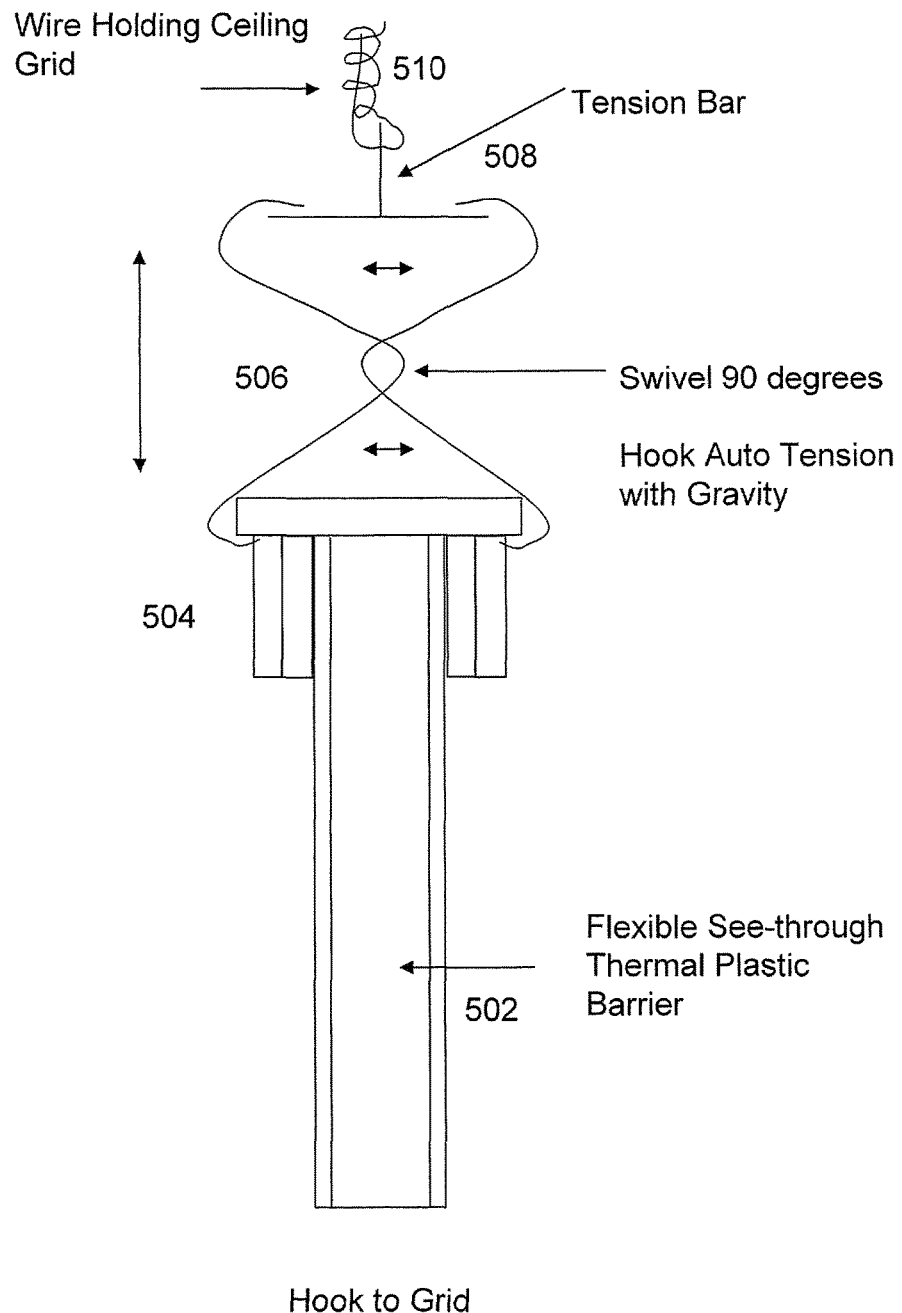
FIG. 5 illustrates an exemplary embodiment of a barrier, which can be rotated and adjusted into various positions by utilizing a hook and swivel mechanism.

Referring now also to FIG. 5, a setup 500 featuring a barrier, which can be rotated and adjusted into various positions by utilizing a hook and swivel mechanism, is illustratively shown. The setup 500 can include a barrier 502, which can be similar to the barrier 118 from FIG. 1 and an end section 504, which can be similar to the end section 300 from FIG. 3. The end section 504 can be configured to hold the barrier 502 in place and can be attached to the thermal cages 101 and/or 201 and the ceiling grid 114 via a hook and swivel mechanism 506. The hook and swivel mechanism 406 can be utilized to rotate the barrier 502 in a variety of directions. For example, the swivel mechanism 506 can rotate the barrier 502 in a position 90 degrees from its current position. The swivel mechanism 506 can cause the barrier 502 to be rotated in other degrees and orientations as well. Additionally, the swivel mechanism 506 can be utilized to accommodate the drop ceiling grid 114, which in certain circumstances can be perpendicular or lateral to the cabinets 102.

The hook and swivel mechanism 506 can be connected or otherwise coupled to a tension bar 508. The tension bar 508 can be made of metal or other materials, and can be configured to resist or otherwise withstand tensile strain. A wire 510, which can be configured to hold the drop ceiling grid 114, can be configured to hold the tension bar 508 in place.

Figure 6:
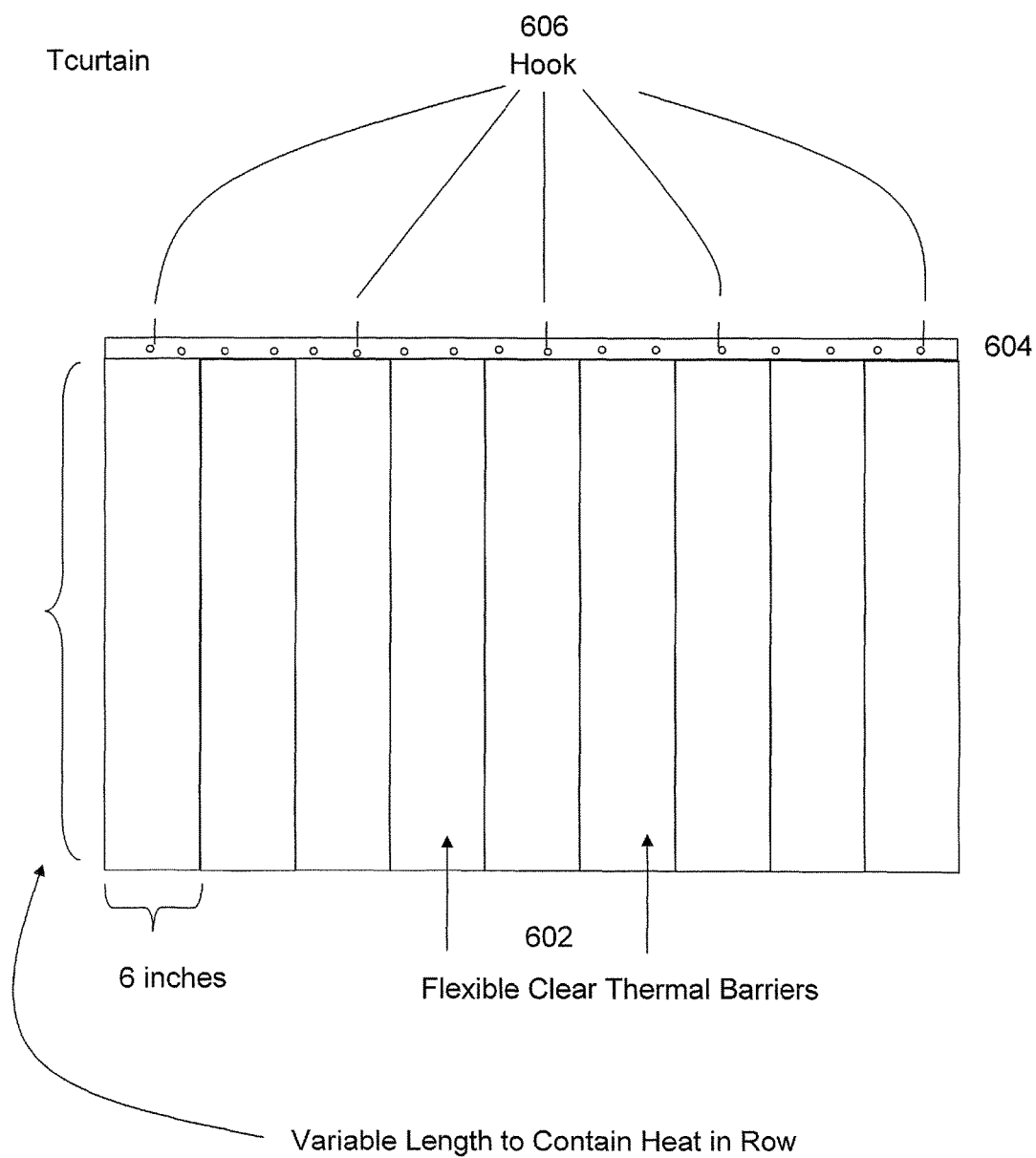
FIG. 6 illustrates an exemplary embodiment of a variable length thermal curtain attached to a rail, which can be connected to a drop ceiling grid.

Referring now also to FIG. 6, a variable length thermal curtain 600 is illustratively shown. The thermal curtain 600 can be similar to thermal curtain 116 and can be comprised of a plurality of flexible barriers 602. The barriers 602 can be six inches wide as shown in FIG. 6, however, other widths can be utilized. The length of the barriers 602 can be variable to allow for different configurations, which can be utilized for devices requiring different environmental conditions. As mentioned above, the barriers 602 can be connected to the thermal cages 101 and 201 and/or the drop ceiling grid 114 via a rail 604, by utilizing a hook mechanism 606.

Figure 7:
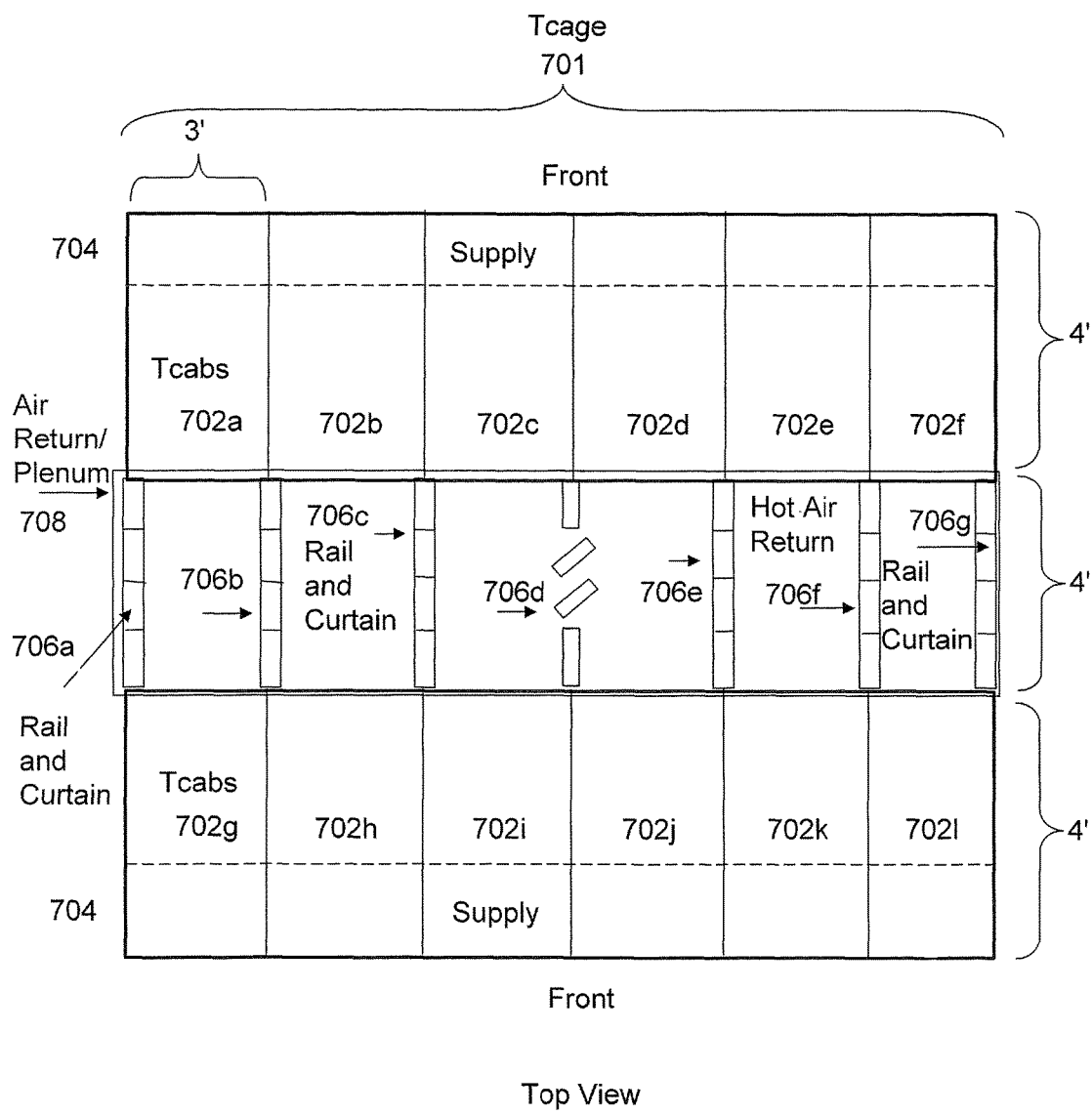
FIG. 7 illustrates a top view of an exemplary embodiment of a thermal management system comprising a thermal cage, which includes a plurality of rows of thermal cabinets, a series of thermal curtains, and a cooling system.

Referring now also to FIG. 7, a top view of a thermal management cabinet system 700, which includes a thermal cage 701 and a plurality of rows of thermal cabinets 702a-l. The thermal cage 701 can correspond, for example, to thermal cage 101, 201 or another thermal cage. The thermal cabinets 702a-l can be arranged in two opposing rows. For example, cabinet 702a faces opposite to cabinet 702g and so forth down the rows. The thermal management system 700 can include air supplies 704, which can be utilized to cool the cabinets 702a-l. In an embodiment, the air supplies 704 can be directly integrated into the thermal cage 701 or be connected to the thermal cage 701 As described above, the air supplies 704 can be located within a false floor that lies underneath the cabinets 702a-l. Cool air can be funneled through openings in proximity to the front of the cabinets 702a-l. The thermal management system 700 can also include a plurality of rails and thermal curtains 706a-g, and an air return/plenum 708. As shown, the rails and thermal curtains 706a-g can be positioned between pairs of cabinets 702a-l. For example, rail and curtain 706a can be placed between cabinets 702a and 702g.

Additionally, the thermal curtains 706a-g can be adjusted in a variety of positions. For example, a pair of barriers in thermal curtain 706d are illustrated as having been adjusted as to orientation so as to account for one or more environmental conditions. The thermal curtains 706a-g can be utilized to direct hot air generated from the electronic equipment residing in the cabinets to the plenum 708. The plenum 708 can then proceed to direct the hot air to a cooling coil or other cooling mechanism (not explicitly shown) for cooling. The cooled air can then be fed through the air supplies 704 to the cabinets 702a-l to cool the electronic equipment housed in the cabinets 702a-l. Notably, any of the components described above for management system 700 can be directly integrated with the thermal cage 701. In other embodiments, the components can be separate from the thermal cage 701, but can then be connected to the thermal cage 701 using various types of connection mechanisms.

Operatively, the thermal management system 100 can be configured to control and/or regulate environmental conditions affecting and/or associated with electronic equipment housed in the cabinets 102 or other similar structures. Air can be utilized to regulate the environmental conditions affecting the electronic equipment. The plenums 110 in the raised floor system 108 and/or the drop ceiling grid 114 can utilize one or more pressure sources, which can create a pressure differential through the housing of the cabinets 102 to cause air to flow through the cabinets 102 and across the electronic equipment. As the air flows across the electronic equipment, the electronic equipment can cause the temperature of the air to be increased.

The thermal management system 100 can include a controller (not explicitly shown) for controlling the environmental conditions. The controller can be a processor, computing device, or other device capable of receiving and/or monitoring data associated with the environmental conditions. In an embodiment, the controller can receive the data from one or more types of sensors. Such sensors can include pressure, humidity, and/or temperature sensors. Of course, other types of sensors can also be utilized. The controller can analyze the data, and if it determines that the environmental conditions are undesirable, it can proceed to adjust the conditions. For example, if the pressure data is outside the proper desired range, the controller can cause one or more devices in the system 100 to adjust the pressure in the system 100 so that the pressure falls or rises into the desired range.

As the air flows across the electronic equipment, the air can be directed away from the cabinets 102 to the drop ceiling grid 114 by utilizing the thermal curtain 116. In an embodiment, the adjustable barriers 118 of the thermal curtain 116 can direct the air in a variety of different paths based on the current position of the barriers 118 to at least one exhaust channel associated with the cabinets 102. The exhaust channels can be in proximity to the vented back doors 106 of the cabinets 102. For example, referring now again to FIG. 7, the barriers in thermal curtain 706d can direct air differently than the barriers in thermal curtain 706a. Once the air has entered the drop ceiling grid 114, the heated air can flow through the drop ceiling grid 114 via the one or more plenums 110. The plenums 110 can direct air to the raised floor system 108 or to another similar system so that the air may be cooled by cooling coils or other cooling mechanisms.

For air that has been directed to the raised floor system 108, a cooling coil (not explicitly shown) in the raised floor system 108 can cool the air as the air flows across the cooling coil. The plenums 110 in the raised floor system can utilize pressure sources, including fans, to cause a pressure differential that can cause the air to flow via one or more supply channels to the openings/inlets 112 of the cabinets 102. The cooled air can then flow across the electronic equipment in the cabinets 102 so as to regulate the environmental conditions affecting the electronic equipment. Once the air flows across the equipment, the air is heated and the process continues as described above. Accordingly, this process can be a continuous process, which can be adjusted by the controller based on the environmental conditions existing in the environment. The air flow can be generated and controlled using various mechanisms and techniques, which are contemplates by the present disclosure including the use of fans, adjustable baffles, and so forth.

Figure 8:
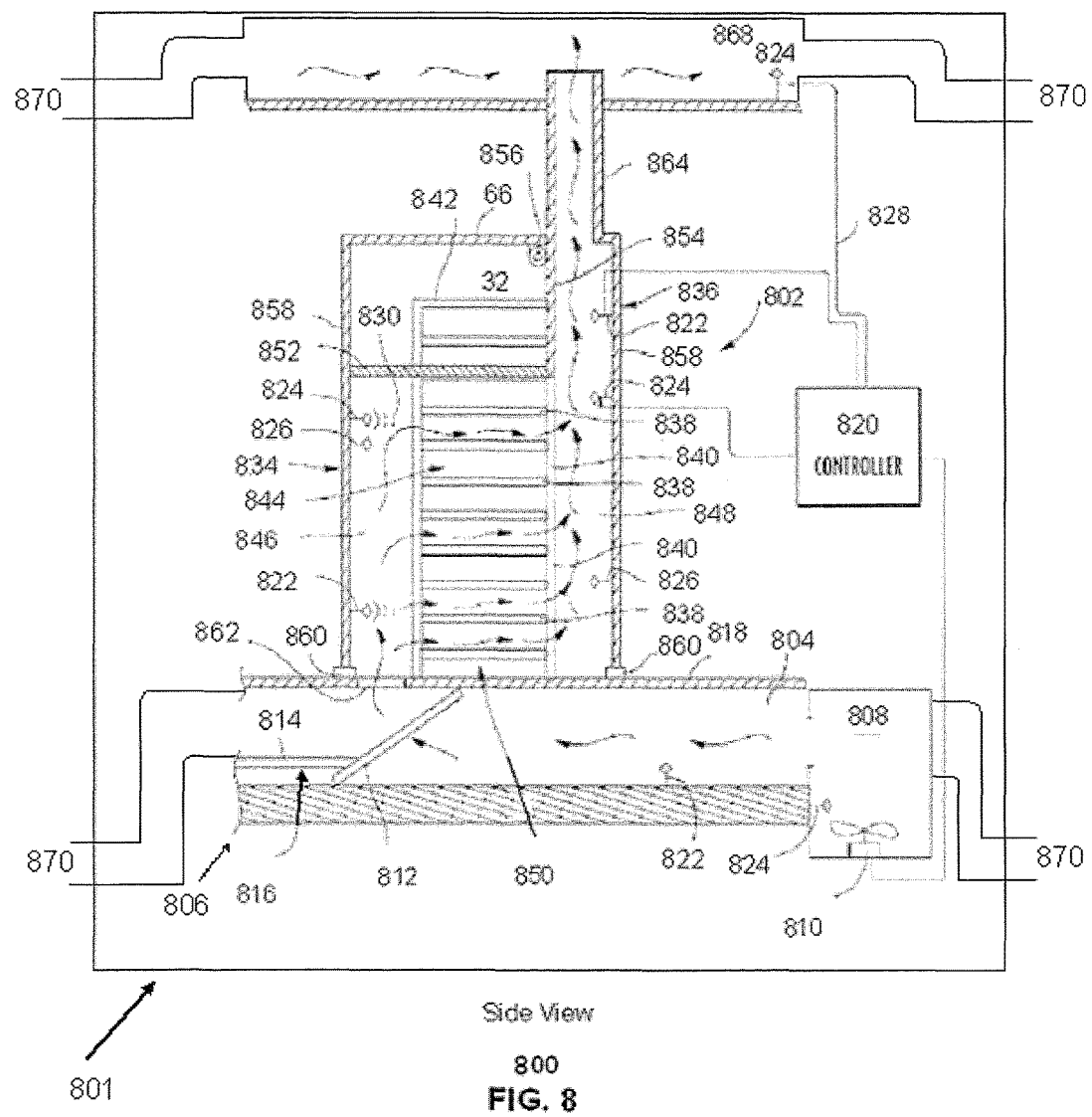
FIG. 8 illustrates a side view of an exemplary embodiment of a thermal management cabinet system with sample airflow patterns.

Other embodiments for providing thermal management can be provided as well. Referring now also to FIG. 8, a side view of a thermal management system 800, which according to an embodiment, illustrates sample airflow patterns, is shown. The thermal management system 800 can include a thermal cage 801. The thermal cage can be utilized to house, store, and/or protect the various components illustrated in FIG. 8. Additionally, the components shown in FIG. 8 can either be directly integrated with the thermal cage 801 or be individually connectable to the thermal cage 801. The thermal cage 801 can include a cabinet 802, which can be utilized to house electronic equipment or other types of equipment, much like the cabinets 102 described above. The cabinet 802 can be configured to store computing devices, servers, storage devices, and other similar devices. In an embodiment, the management system 800 can include multiple cabinets 802 and is not, therefore, limited to having one cabinet 802. The multiple cabinets 802 can be arranged in a plurality of rows, although other arrangements are contemplated by the present invention.

For example, the cabinets 802 can be arranged in an annular configuration (e.g., concentric rows). The particular configuration of the rows can be selected based on a number of factors, including facilitating adjustment of environmental conditions associated with the cabinets 802 and/or maximizing efficient use of limited facility space. In an embodiment, each row can have varying environmental conditions associated with it. For example, one row of cabinets 802 can be utilized to house servers that may require a large amount of cooling in comparison to a second row of cabinets 802, which can house other types of devices which may require less cooling. Grouping the rows according to environmental conditions and/or requirements, such as grouping the rows based on temperature and humidity range, system 800 can more efficiently control the environments since devices requiring similar conditions are grouped accordingly.

In another embodiment, rows of cabinets 802 can be organized based on the amount of cooling that a particular row needs. For example, cabinets 802 that need the least amount of cooling can be positioned far away from the cooling source, whereas cabinets 802 needing the greatest amount of cooling can be positioned as close the cooling source as possible. Additionally, multiple configurations for delivering air to the cabinets 802 in the system 800 can exist. For example, the system 800 can include a supply channel 804, which can supply cooled air to multiple cabinets 802 in the system 800. In an embodiment, each cabinet 802 can be directly connected to the supply channel 802 so that each cabinet 802 can receive air that flows directly from a cooling subsystem 806 instead of from another cabinet 802.

In one embodiment, the cabinets 802 can be arranged so that at least a portion of the cabinets 802 receive cooling in series. For example, a first set of cabinets 802 needing a significant amount of cooling can directly receive air that has been cooled by the cooling subsystem 806. This cold air can flow across the electronic equipment of the cabinets 802 and then can be directed towards a second set of cabinets 802 which need lower levels of cooling. After flowing across the first and second set of cabinets 802, the air can then be returned to the cooling subsystem 806 for removal of the heat that has been transferred to the air by the first and second sets of cabinets 802.

The thermal management system 800 can include one or more plenums 808, which can be in fluid communication with the cabinets 802. Notably, the plenums 808 can be pressurized. For example, the system 800 can utilize a plenum 808 so that the pressure differential is centrally generated. In another example, multiple pressurized plenums 808 can be utilized, such as one or more plenums being utilized for each row. The plenum 808 can have one or more pressure sources, such as fan 810, although other pressure sources are also contemplated including pumps and the like. In an embodiment, the fan 810 can be a centrifugal fan and can include noise-absorption components and anti-vibration mounting components. Various filters and other components can be utilized in combination with the fan. In one embodiment, the fan 810 can be an adjustable speed fan to increase or decrease the pressure in the plenum 808. For example, the fan 810 can be a variable frequency drive fan. In another embodiment, a plurality of fans 810 can be in communication with the pressurized plenum 808 so that the pressure can be increased by operating additional fans of the plurality of fans. The present disclosure also contemplates the fan configuration being modular. For instance, the fans 810 can be easily added to the plenums 808, such as by removing a blocking plate that seals a wall of the plenum 808 in the absence of the fan 810.

The cabinets 802 can be bound on a first side by a cold zone and bound on a second side by a hot zone. In an embodiment, the cold and hot zones can have access areas that have doors, which can allow technicians to access the cabinets when needed (such as for adding or removing the electronic equipment). However, the present disclosure also contemplates the cold and hot zones being integrally formed with the cabinets 802 and/or defined by an insulated false wall between the access areas and the cabinets. In an embodiment, each cabinet 802 in a row can share a cold zone and a hot zone. However, the present disclosure contemplates other configurations of cold and hot zones, such as individual cabinets 802 or groups of cabinets 802 in a single row having their own cold and hot zones. Adjacent hot and cold zones can be separated by a wall.

The pressurized plenum 808 can generate a pressure differential between a cold zone and a hot zone, thereby causing air to flow across the electronic equipment in the cabinets 802 which removes heat from the equipment. The number and configuration of plenums 808 that are utilized to generate the desired pressure differential can vary based on a number of factors, including the type of electronic equipment that is being environmentally managed. For example, a plurality of plenums 808 can be in fluid communication with the cold and hot zones of each row. The pressurized plenums 808 can generate positive pressure and/or negative pressure to create the desired pressure differential and thereby create air flow over the electronic equipment. For instance, a first pressurized plenum can generate a positive pressure (e.g., a desired pressure above ambient) in proximity to the cold zone, while a second pressurized plenum generates a negative pressure (e.g., a vacuum) in proximity to the hot zone.

In one embodiment, the use of pressurized plenums 808 allows system 800 to isolate fans 810 from the electronic equipment. For example, the pressurized plenums 808 can increase air pressure using pumps so that the system 800 does not utilize any fans 810. In another example, the pressure increase can result from the use of fans that are positioned remotely from the cabinets 802 so that air flow from the fans does not directly contact the electronic equipment (e.g., the fans create air flow within the plenum 808 that results in an increased pressure in the plenum 808 which is in turn communicated to the cabinets 802). The air passing over the electronic equipment is utilized to remove heat from the equipment. In turn, the cooling subsystem 806 can then remove the heat from the air.

In one embodiment, the cooling subsystem 806 can be a vapor-compression cycle system, although other systems are also contemplated by the present disclosure. The subsystem 806 can include a pump and one or more chillers for cooling water or other coolant (e.g., chilled liquid settings between 15 and 50 degrees Fahrenheit) which is then supplied to coils 812 via supply lines 814 and return lines 816. The coils 812 can be positioned in thermal communication with the hot zone. For example, the coil 812 can be positioned under the floor 818 so that the air coming from hot zone passes through the coil 812, then through the pressurized plenum 808 and back into the cold zone. The particular number and configuration of coils 812 that are utilized can vary based on a number of factors, including the number of pressurized plenums 808 and configuration of the cold and hot zones that are being utilized. For example, each row of cabinets 802 can have six equidistantly positioned pressurized plenums 808 under the floor 818 with a coil 812 in thermal communication with each of the plenums (e.g., positioned downstream of the hot zone and upstream of the cold zone for each plenum).

To control the environment surrounding the electronic equipment, a controller 820 can be utilized. The controller 820 can be a machine within which a set of instructions, when executed, may cause the machine to perform any one or more of the methodologies discussed herein. In some embodiments, the machine can operate as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment. The machine may comprise a server computer, a client user computer, a personal computer (PC), a tablet PC, a laptop computer, a desktop computer, a control system, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein. The exemplary embodiment described herein can utilize various power sources, including backup generators and the like. In one embodiment, solar energy can be utilized as a power source. The power can be based on various voltage sources and can include a medium voltage supply as well as a 480v supply.

The controller 820 can be in communication with one or more sensors for receiving environmental information associated with the electronic equipment. For example, one or more temperature sensors 822 and one or more pressure sensors 824 can be positioned with respect to the electronic equipment so that the sensors can capture environmental information and transmit the information to the controller 820. The particular positioning of the sensors can vary. For instance, temperature sensors 822 can be placed both upstream and downstream of the coil 812 so that the cooling efficiency of the coil 812 can be easily monitored, while other temperature sensors 822 can be placed in close proximity to the electronic equipment so that the amount of heat being generated by the electronic equipment can be more easily monitored. The pressure sensors 824 can be placed both upstream and downstream of the pressurized plenum 808 so that the pressure differential can be more easily monitored. The type of sensor used to capture the environmental information can also vary, including pressure and temperature transducers and thermocouples.

In one embodiment, other sensors can also be used to further monitor the environmental conditions associated with the electronic equipment, such as humidity sensors 826 and flow sensors (not explicitly shown). The humidity sensors 826 allow the controller 820 to monitor the humidity that the electronic equipment is being exposed to and to adjust the humidity accordingly, such as through use of a de-humidifier that is in fluid communication with the electronic equipment. The flow sensors can allow the controller 820 to monitor the flow rate of air, such as for determining heat transfer via convection. The use of flow sensors can also be used for determining other environmental characteristics, such as air flow turbulence, that can have an adverse impact on the cooling of the electronic equipment or the equipment itself. The sensors can communicate with the controller 820 via hardwire (e.g., cables 828) and/or wireless links 830. The particular communication protocols that are utilized can vary and can include Wireless Fidelity or WiFi services, Bluetooth, GSM, CDMA, UMTS, WiMAX, and so forth. A combination of communication techniques can also be utilized, such as allowing the sensors to communicate both wirelessly and via hardwire to provide redundancy so that data is not lost in the event of a link failure.

Notably, the controller 820 can receive the environmental information from the sensors and adjust the environmental conditions accordingly. In one embodiment, each of the cabinets 802 can have a range of environmental conditions that are acceptable. In real time, the controller 820 can receive the environmental information associated with each of the cabinets 802, and then in real time can adjust one or more of the temperature, pressure and humidity associated with the cabinets 802. For example, the controller 820 can determine that a first cabinet 802 needs to lower its temperature by a desired amount. The controller 820 can then transmit control signals for making the appropriate adjustment to achieve the desired temperature change. For instance, the controller 820 can transmit a control signal to the cooling subsystem 806 to increase coolant flow to the coil 812 that is associated with the particular cabinet 802 or to decrease the temperature of the coolant that is being provided to the coil 812. In one embodiment, the controller 820 can transmit a control signal to the cooling subsystem 806, which designated a desired temperature, and the subsystem 806 can then implement the necessary steps to achieve the desired temperature.

As another example, the controller 820 can transmit a control signal to the pressurized plenum 808 that is associated with the particular cabinet 802 so that the pressure differential is increased thereby increasing the air flow through the particular cabinet 802. In one embodiment, the controller 820 can independently utilize the pressurized plenum 808 and the cooling subsystem 806 to adjust the temperature associated with a particular cabinet 802. In another embodiment, the controller 820 can utilize both of the pressurized plenum 808 and the cooling subsystem 806 to adjust the temperature associated with a particular cabinet. As another example, the controller 820 can determine that a first cabinet 802 needs to decrease its air flow rate through the cabinet 802 by a desired amount. The controller 820 can then transmit control signals for making the appropriate adjustment to achieve the desired air flow rate. For instance, the controller 820 can transmit a control signal to the pressure source 810 of the pressurized plenum 808 to decrease the pressure within the plenum 808 that is associated with the particular cabinet 802.

In one embodiment, a damper can be utilized for air flow control. For instance, the damper can be positioned downstream of the pressurized plenum 808 and opened or closed using an actuator (e.g., a servo-motor or other movable control device). In this example, the controller 820 can restrict air flow to the particular cabinet 802 by sending control signals to the actuator which results in the damper moving towards a closed position. The controller 820 can also utilize historical information to provide environmental management for the cabinets 802. For example, the controller 820 can monitor the temperature of particular cabinets 802 based on particular times of the day and adjust the environmental conditions of the cabinets 802 in anticipation of those temperatures. For instance, historical data may show that electronic equipment in a particular cabinet 802 is typically being used to capacity during the morning with a resulting elevation of cabinet temperature during those morning hours. The controller 820 can adjust the temperature in the particular cabinet 802 to a lower portion of the desired range in anticipation of the increased temperature in the morning. The historical data can be maintained in a memory of the controller 820 or can be stored elsewhere and retrieved by the controller 820.

Additionally, in an embodiment, the controller 820 can also maintain historical information associated with the efficiency of the thermal control being implemented by the controller 820. For example, the controller 820 can implement several different techniques for achieving a desired environmental condition and compare the techniques to determine which was the most efficient. For instance, where a temperature decrease is needed, the controller 820 can on a first occasion utilize an increase in pressure differential to achieve the lower temperature. On a second occasion, the controller 820 can utilize the cooling subsystem 806 to achieve the lower temperature. The controller 820 can then determine efficiency based on such factors as the amount of time needed to achieve the lower temperature, the amount of power utilized in achieving the lower temperature and so forth. In this example, the controller 820 can then utilize this historical information to determine which thermal management techniques should be utilized in the future based on the particular circumstances.

In one embodiment, other factors can also be analyzed by the controller 820 for determining the particular technique to utilize to achieve the desired environmental condition. For instance, vibration or noise can be monitored with respect to the use of certain components of the system 800 and the amount of vibration or noise can be a factor in determining which technique (e.g., which cooling components) should be utilized. In another embodiment, blowers can be housed in plenums 808 for providing a pressure differential to the computer devices, such as racks. The blowers can engage with channels so that the blowers can be slid or otherwise positioned in fluid communication with the racks. For example, the channels can guide a blower housing, such as along roller bearings, so that the housing can travel into a desired position. The channels can be of various types, including U-shaped channels. In this example, the blower housing provides for a modular relationship with the racks so that blowers can be easily added as the number of racks is increased, removed as the number of racks decreases, or accessed for repair or the like.

In one embodiment, the racks can be positioned above the blowers and a controllable damper can be utilized. In another embodiment, air flow can be more closely controlled through use of a first controllable damper, such as motorized cone damper, and a second damper, such as motorized damper. The controllable dampers can be of various types including extruded aluminum dampers having opposed or parallel airfoil blades, such as CD40 or CD504 Extruded Aluminum Dampers manufactured by Ruskin®. In one embodiment, the dampers utilize four inch wide airfoil blades that pivot between open and closed positions within a square frame. Cooling coils, such as coil 812, can be placed in the air flow path of the blowers and drain pans or other water collection devices can be placed under the coils. In one embodiment, the drain pans can have leak detectors connected thereto. A dehumidifier, such as an ultrasonic dehumidifier, can be placed in fluid communication with the racks. The coils and/or dehumidifier can be connected with a water chilled loop system.

In another embodiment, the cabinets 802 can have generally solid side walls 832, a front 834 and a back 836. The cabinet 802 may be used to house a plurality of servers or other pieces of electronic equipment, including routers, DSLAM's and so forth. Suitable dimensions for the cabinet 802 can vary depending on a number of factors including the type of electronic equipment, the facility space available, and the thermal management resources (e.g., the insulation factors, cooling power and so forth) but can include a height of 7 feet, a width of 3 feet and a depth of 4 feet. Additionally, the cabinet 802 may include generally L-shaped horizontal rails 838 attached to, and supported by, four vertical rail supports 840 which form part of a frame 842 that is positioned in the interior of the cabinet 802. A plurality of rails 838 may be provided in pairs to form shelving brackets on which electronic components can be supported. The rails may have any suitable formation, one suitable formation being standard square hole rails that may be positioned 19" apart to form a 19" rack. The rails may be mounted to the vertical rail supports 840 and define the depth of the racks for housing the electronic components.

The vertical rail supports 840 and the rails 838 can define an electronic component storage area 844 that is located within the frame 842. The positioning of the frame 842 can define a front service area 846 forward of the frame to the front 834 of the cabinet, a rear service area 848 rearward of the frame to the back 836 of the cabinet 802. Two side service areas 850 can be defined to the sides of the frame 842. The cabinet 802 can be designed to be 42 U in height, with "U," or rack unit, being a unit of measure used to describe the height of equipment intended for mounting in a 19-inch rack or a 23-inch rack (the dimension referring to the width of rack). One rack unit can be 1.75" (44.45 mm) high. Thus, a suitable number of rails 838 can be provided to equal the desired height of the cabinet 802, with the rails 838 being spaced a suitable number of rack units apart.

An insulated thermal management plate 852 can be provided, which can be moved within the cabinet 802. The thermal management plate 852 can be formed of any suitable material. In one arrangement, the plate 852 can be formed of ABS plastic with a foam insulation backing. The thermal management plate 852 can extend from the front 834 of the cabinet 802 towards the back 836, typically to the rear vertical rail support 840 which marks the front end of the rear service area 848. The electronic components to be housed within the cabinet 802 can be stored within the cabinet 802, such as starting from the lowest rack and working upwards. The thermal management plate 852 is easily movable within the cabinet and is typically placed within the cabinet 802 just above the height of the highest electronic component that is stored within the cabinet 802. The plate 852 may be attached to the rails 838 that are positioned directly above the top-most electronic component, or may simply be rested thereon. At the front edge of the thermal management plate 852, the corners may be chamfered or cut off.

An insulated thermal curtain 854 can be provided at the back 16 of the cabinet 10. The thermal curtain 854 is preferably made of a composite material, though can be formed of any suitable material. The curtain 854 can be suspended from a deployment device 856, such as a spring loaded or ratcheted roller mechanism that is attached at the top of the frame 842. The curtain 854 can either be mounted within or adjacent to the rear rail supports 840 such that it is located at the edge of the rear service area 848. A bottom bracket can enable the curtain 854 to be easily raised and lowered. Typically, the curtain is lowered until it is level with the thermal management plate 852. The curtain 854 can be formed of a thermal insulating material that prevents heat transfer. U-markings 30 may be provided on the curtain at 1.75" intervals, along with a company logo for the cabinet manufacturer. With a 19" rack width, the curtain 854 can be 20" wide.

The curtain 854 can run in, or otherwise be guided by, vertical U-shaped rails attached to the vertical rail supports 840 such that the curtain 854 provides a generally sealed barrier to the transport of air. It should be appreciated, that although the arrangement has curtain 854 provided at the back 836 of the cabinet 802, it may alternatively or in addition be provided at the sides of the cabinet, and/or at only one of the front 834, back 836 or sides of the cabinet 802. In other arrangements, the thermal curtain 854 can be positioned at the front 834 of the cabinet 802. The thermal management plate 852 and the thermal curtain 854 can be used to separate the interior space of the cabinet 802 into different zones by forming baffles to the air flow and heat transfer. A cold zone can be defined within the front service area 846, bounded at the rear by the electronic components that are stored within the racks, and at the top by the thermal management plate 852.

The front door, the sides 832 and the bottom of the cabinet 802 can form the other boundaries of the cold zone. A hot zone can be defined within the rear service area 848, bounded at the front by the electronic components that are stored within the racks and by the thermal curtain 854 that extends from the top of the cabinet 802 to the thermal management plate 852. The sides 832, the rear door, the bottom and the top of the cabinet 802 can form the other boundaries of the hot zone. A neutral heat zone can be formed above the cold zone, defined between the top of the cabinet 802, the thermal management plate 852, the sides 832 of the cabinet, the front door of the cabinet 802 and the thermal curtain 854. Thus, the hot zone typically forms the entire volume of the rear service area 848, while the front service area 846 and the electronic component storage area 844 can be split vertically by the horizontally-oriented plate 852 into the neutral heat zone at the top and the cold zone at the bottom.

Air flow within the cabinet can go first from the cold zone rearward through the electronic component storage area 844 where it becomes heated due to contact with the electronic components therein and exits into the hot zone. The air can then flow vertically upwards within the hot zone to exit the cabinet. The neutral zone is designed to be cut off from this air flow by the thermal management plate 852 and the thermal curtain 854. The neutral zone formed above the thermal management plate 852 can be used for storage for equipment such as laptops or other devices. In other arrangements, a thermal curtain 854 may be provided without provision of a thermal management plate 852, in which case the thermal curtain may be positioned to either the front or back of the storage area 844, or at any location therebetween such as at the center thereof. The thermal curtain 854 can be mounted to the top of the cabinet, and can be simply extended downwardly until it reaches the top-most electronic component stored in the storage area 844. This arrangement thus splits the interior of the cabinet 802 into a hot zone and a cold zone by vertically dividing the space using the thermal curtain 854. In one embodiment, one or more cable trays or other structural guides can be provided for facilitating positioning of cables within the cabinet 802.

The system 800 can further include one or more power distribution units (PDU's). The PDU can include main and distribution circuit breakers as well as various power regulation components, including 300 KVA transformers and multi-pole panelboards. In yet other arrangements, the thermal management plate 852 can extend from the front 834 of the cabinet 802 to the front vertical rail supports 840, and the thermal curtain 854 can be provided close to the front vertical rail supports 840. This creates a smaller neutral heat zone but still performs the function of preventing the cold zone from extending the full height of the cabinet 802 when the electronic components are not necessarily stacked up to the top of the cabinet 802.

Moreover, adjacent to the vertical rail supports 840 at the front 834 and back 836 of the cabinet 802, a plurality of air management fingers and/or brushes (not explicitly shown) can be provided, which can extend to the sides or front/back of the cabinet 802. The fingers can be formed of a non-thermally conductive flexible material, such as a foam, rubber or plastic material. The fingers can be generally rectangularly shaped and can be attached at one end only to a support which is attached the rail supports 840. Each finger can be separately moveable, and can allow cables to be passed therethrough by pushing the cables in between adjacent fingers. The brushes can be similarly arranged, attached at one end only to the rail supports 840. In another embodiment, the brushes can be provided on supports on either side of the gap between the rail supports 840 and the sides/front/back of the cabinet such that the brushes meet in the middle.

In one arrangement, a set of fingers can extend from the rail supports 840 to the sides 832 of the cabinet at the rear edge of the front service area 846. A set of brushes can extend from the rail supports 840 to the rear 836 of the cabinet 802. The side service areas 850 can thus be defined by the fingers and brushes, such that they are bounded at the front by the fingers, at the sides by the sides 832 of the cabinet at the sides of the electronic components stored in the storage area 844 and the brushes, and at the rear by the rear 836 of the cabinet 802. The side service areas 850 can thus be generally separated from the airflow in the cabinet by the fingers and/or brushes, which foam baffles, and the side service areas 850 thus form secondary neutral heat zones. It will of course be appreciated that any arrangement of brushes and/or fingers can be employed to both provide a separation of the air flow from the side service areas 850 and still to allow cables to be threaded into and through the side service areas 850 for appropriate cable management purposes.

In another arrangement, in place of or in addition to fingers and/or brushes, flexible foam insulation pieces can be used. The foam pieces may be provided in two parts: a generally thin rectangular piece may be extended vertically from the cut corners of the thermal management plate 852, and a generally triangular-section piece may be attached to a door 858 of the cabinet. When the door 858 is closed, the two foam pieces and can abut one another. Cables can then be run from the electronic components stored on the rack through the abutting foam pieces to the side service areas 850. The foam insulation pieces can thus form baffles between the cold zone and the neutral heat zone of the side service areas 850. However, it should be understood that other insulating techniques and structures can be used, including other insulation means in place of the foam pieces.

The sides 832 may each include one or more removable side panels to allow access between cabinets. The sides 832 and side panels may be constructed of lightweight composite materials with non thermal conductive properties. Insulation may also be provided on the side panels. In some arrangements, the sides 832 may include one or more punch out panels so that cables may be run from servers stored in one cabinet 802 to servers stored in another cabinet 802. As the side service areas 850 are generally neutral air zones, it does not affect the cooling capabilities of the cabinet airflow to provide punch out holes in the sides. The back 836 and the front 834 may both include one or more doors 858. The door 858 may have a side hinge, and may be constructed of lightweight composite materials similar to the sides 832, and may also be insulated. In one embodiment, a double door may be provided, which has the advantage of allowing a decrease in necessary aisle space between cabinets that face one another. The door may include a temperature sensor that may be viewed without opening the door. The temperature sensor may be provided behind a window in the door, or may have a sensor part mounted inside the cabinet and a display part mounted on the outside of the door. The door may include a combination lock, or other locking mechanism. A rubber or other seal (not shown) may be provided around the doors 858, to help to seal any air gaps that might be created.

The cabinet 802 may be mounted on a modular base 860, forming a bottom of the cabinet 802. The base may measure 3' wide by 4' long, and may allow access to a raised floor system 806 such as a TATE 24"×24" modular access floor system. A front section 862 of the base 860 is open to the subfloor, and registers with corresponding openings that are created to the raised floor system. A plurality of feet can be provided to bear the weight of the cabinet. A skirt (not shown) may surround the feet to prevent cool air from exiting around the base 860. An airflow duct or chimney 864 may extend from a top 866 of the cabinet 802. It should be understood by one of ordinary skill in the art that the chimney can be removed from the embodiment such that the hot air flows directly into the room such as through a perforated back of the cabinet (not shown). The duct 864 can extend generally from an area of the top 866 that is adjacent to the back 16 of the cabinet. The duct 864 is dimensioned to extend into a ceiling space 868 such as an above-ceiling plenum for venting hot air to a venting means (not shown).

The duct 864 may be flexible so that it can be easily connected to the ceiling even in the event of imperfect positioning of the cabinet 802 below a vent panel into the ceiling space 868. In one arrangement, the duct 864 can be formed of a flexible fabric or plastic material. In another embodiment, the duct 864 can be formed of a rigid material. The ceiling space 868 may be a standard drop ceiling system. Various components can be provided in the top 866, such as a power raceway and a public communications raceway, both of which may be open to the room. A divider may divide the public communications raceway for fiber and copper cables. A patch panel can extend from the public communications raceway into a private communications raceway for pass through of cables into the interior of the cabinet 802. Dividers may be included in the private communications raceway for dividing the space for fiber and copper cables. Junction boxes may be provided in the power raceway for supply of power to the power circuit in the cabinet. Power strips and cable managers may be provided adjacent the back 836 of the cabinet 802. It will be appreciated that the arrangement of components at the top 866 of the cabinet 802 can be varied to suit the particular application.

In use, the cabinet 802 can be installed over a raised access floor 806 that is provided with cooled air from an HVAC or other system. The base 860 can be registered with openings in the floor 818. The chimney can be extended into a drop ceiling 868. The electronic components can be installed on rails 838, and are appropriately cabled by passing cables through the foam pieces, fingers and/or brushes into the side service areas 850. Standard cable management ladders may be employed in the side service areas 850 to hold the cables at the right height and to allow them to be passed to the tops of the cabinet. The cables are run to the top of the cabinet 802 for connection to the power supply and to communications cables, which may be connected to other servers using standard overhead ladder racks. The doors 858 are then closed.

As the electronic components are operated, they generate heat which is forced to the rear service area 848 by the airflow coming into the cold zone of the front service area 846 of the cabinet via the aperture 862 at the front of the cabinet 802. The hot zone created in the rear service area 848 due to the heating effect of the electronic components causes the air to flow up through the duct 864. The air thus circulates from the cold zone, through the electronic components in the storage area 844 to the hot zone and up into duct 864. The various baffles such as the thermal management plate 852, thermal curtain 854 and foam pieces, fingers and/or brushes constrain the airflow into the smallest possible space within the cabinet, and prevent hot and cold air mixing other than through the electronic component storage area 844. In one embodiment, the plate 852 is not utilized with the cabinet. In order to ensure that sufficient cool air is delivered to the upper most electronic components, one or more flow diverters can optionally be used. For example, a perforated curtain or a series of plates, may be used. Such arrangements can help to keep cool air flowing towards the top servers rather than allowing it all to be directed to the lower servers.

In one exemplary embodiment, the cabinet enclosure can have an inlet and an outlet in proximity to a bottom portion of the cabinet enclosure. A supply channel can be connected with the cabinet enclosure inlet. The cabinet enclosure can be positioned on a floor and the supply channel can be under the floor. An exhaust channel can be connected with the cabinet enclosure outlet. One or more plenums can be in fluid communication with at least one of the supply and exhaust channels. The plenums can have a pressure source for generating a pressure differential through the enclosure of the cabinet enclosure causing air to flow therethrough. A cooling coil can be positioned under the floor and in thermal contact with the supply channel. A coolant can flow through the cooling coil to remove heat from the air flowing through the supply channel.

In one exemplary embodiment, a thermal management cabinet for electronic equipment can include a cabinet frame having side walls and defining a front, a back, a top and a bottom, where the cabinet forms a generally sealed enclosure for electronic equipment. An electronic component storage area including at least one shelving rack for supporting electronic equipment can be defined in an interior section of the cabinet. At least one opening can be included in the top of the cabinet, and at least one opening can be included in the bottom of the cabinet. The cabinet can be dimensioned to extend between a raised access floor of a building and a drop ceiling of a building, where the access floor carries cooled air and the drop ceiling venting heated air. The bottom opening of the cabinet can be alignable with an opening in the access floor such that cool air from the access floor passes into the cabinet and flows through the electronic component storage area to exit the cabinet through the top opening, which is alignable with an opening in the drop ceiling.

The cabinet interior can be separated into temperature zones comprising at least a cold zone supplied with air from the bottom opening of the cabinet and a hot zone for venting through the top opening, with at least one baffle provided to create the temperature zones such that air is directed to flow from the cold zone through the electronic component storage area to the hot zone. In one arrangement, the baffle can comprise a thermal management plate that is positioned horizontally in the cabinet above the electronic component storage area. The thermal management plate can be formed of insulated material such as a plastic material backed with an insulator. In another arrangement, the baffle can comprise a heat transfer curtain that is positioned vertically in the cabinet above the electronic component storage area. The heat transfer curtain can be formed of a composite material. In yet another arrangement, the baffle can be flexible and can allow cables to be passed through areas of the cabinet while providing a heat transfer barrier. The flexible baffle can comprise at least one of flexible fingers, foam insulation and brushes. The flexible fingers and brushes can extend from the electronic component storage area to at least one of the side walls, front and back of the cabinet. The at least one foam insulation can comprise two flexible foam pieces positioned to allow cables to be passed therebetween.

In another embodiment, a duct can extend from the top opening of the cabinet for connection to a drop ceiling. The duct can be formed of a flexible material such as a fabric material. At least one door can be provided in at least one of the front and back of the cabinet. The at least one door can be a double door. Insulation pieces can be provided adjacent at least one hinged edge of the at least one door. The insulation pieces can form a flexible baffle, and can comprise two flexible foam pieces positioned to allow cables to be passed therebetween. At least one side of the cabinet can include a removable panel. At least one punch hole having a removable plug can be provided in at least one side of the cabinet. At least one airflow management structure can be provided adjacent to the bottom opening of the cabinet, which may be a perforated curtain. In one embodiment, the system can comprise a plurality of data containers (e.g., 40 feet long) with sixteen cabinets and two PDU's each equaling 144 customer cabinets and three associated 40' power support units.

Figure 9:
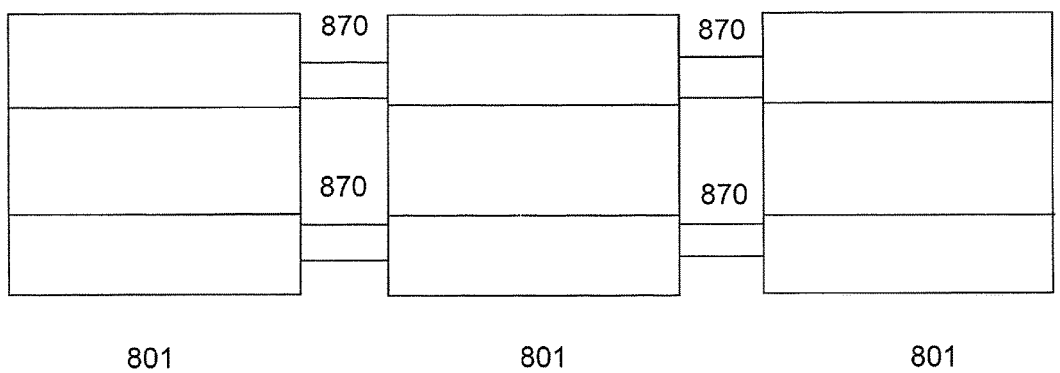
FIG. 9 illustrates a group of thermal cages connected to one another by utilizing connection mechanisms.

In an embodiment, the thermal management system 800 can also include one or more connection mechanisms 870. The connection mechanisms 870 can, for example, allow for a fluid connection of the thermal cage 801 with one or more other thermal cages. Connection mechanisms 870 can include connectable conduits, ducts, tubes, or other similar devices which can effectively connect the plenums or other components of the thermal cages 801. The connection mechanisms 870 can also include quick connect and/or removable connection mechanisms to facilitate configuration of a facility through use of a modular system. Referring now also to FIG. 9, a group 900 of three thermal cages 801 connected using the connection mechanisms 870, is illustratively shown. Once connected to another thermal cage, the thermal cages can share raised floor systems, drop ceiling grids, resources, air flows, surveillance systems, biometric devices, and any other components associated with the thermal cages. This can increase efficient use of resources by reducing the need for creating additional thermal cages when currently existing thermal cages can simply be connected to one another. Additionally, controller 820 can be utilized to control each of the three thermal cages 801 and adjust the environmental conditions for all of the thermal cages 801 simultaneously.

Notably, features of the thermal management system 800 can be combined or otherwise associated with the other systems described above and/or the methods described below.

Figure 10:
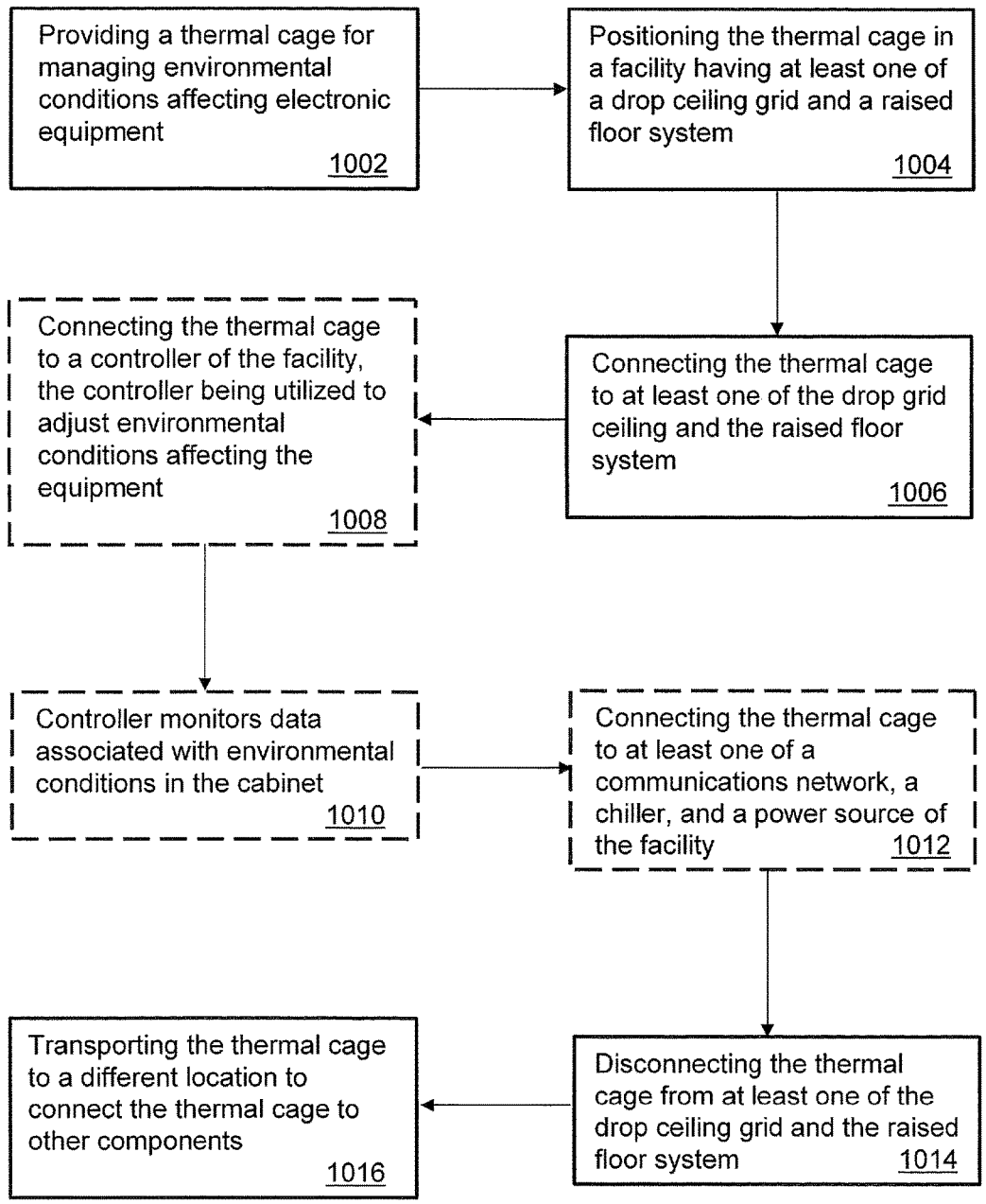
FIG. 10 illustrates an exemplary embodiment of a method for providing thermal management to electronic equipment, which utilizes a thermal cage.

Referring now to FIG. 10, an illustrative method 1000 for providing thermal management to electronic equipment by utilizing a thermal cage, which is operable with the thermal management systems and components of FIGS. 1-9. Notably, the method 1000 is not intended to be limited to the systems and components described above or illustrated in the drawings. The method 1000 can begin with step 1002, which can involve providing a thermal cage, which can be utilized to manage environmental conditions for electronic equipment. The thermal cage can be configured to store various types of cabinets and electronic equipment and can be made out of steel-mesh, plastics, metals, or other materials suitable for these purposes. Additionally, the thermal cage can be designed and constructed based on desired specifications. For example, if the electronic equipment includes large servers the thermal cage can be built with dimensions which allow for the cage to house the servers. Furthermore, the thermal cage can include a thermal curtain which can include one or more adjustable barriers for directing air flowing through cabinets in the thermal cage to a plenum.

The thermal cage can also be configured to be movable such as by utilizing wheels or other mechanisms which allow for transporting the thermal cage from one location to another including within or from outside of a facility. The thermal cage can also be configured to have doors or other means for allowing a technician to access equipment stored within the thermal cage. At step 1004, the thermal cage can be positioned into a facility, which can include a drop ceiling grid and/or a raised floor system such as those described above. The drop ceiling grid can be configured to include one or more plenums, which can be utilized to cause air to flow through the thermal cage, thermal cabinets, and/or across electronic equipment stored within the thermal cage. The raised floor system can provide cooled air to cool the electronic equipment such as by utilizing a cooling coil to cool air supplied to the raised floor system. Additionally, the raised floor system can be positioned under cabinets in the thermal cage so as to allow the cool air to be channeled into an inlet of the cabinet.

At step 1006, the thermal cage can be connected to the drop ceiling grid and/or the raised floor system. The thermal cage can be fitted with components that can allow the thermal cage to be easily attached or detached from the drop ceiling grid or the raised floor system. For example, the thermal cage can include fasteners, clasps, or other similar mechanisms for attaching the thermal cage. Once connected to the drop ceiling grid and/or the raised floor system, the thermal curtain can direct air flowing through the thermal cage/cabinets to the plenum. The plenum can then cause the air to flow through the thermal cage and/or the cabinets by utilizing one or more pressure sources, which can create a pressure differential through the housing of the cabinet/thermal cage to cause the air to flow through the cabinet and across the electronic equipment. Prior to arriving at the cabinet and electronic equipment, the air can be cooled by the cooling coil and then supplied to the thermal cage. As the air is flowing across the electronic equipment in the cabinet, the air may heated by the electronic equipment and then be directed by the thermal curtain to the plenum again. As the air is being directed to the plenum by the thermal curtain via an exhaust channel, the plenum can direct the hot air to the cooling coil again. The process can continued as needed. In an embodiment, the thermal curtain can direct heat and air flow for multiple cabinets at a time.

Optionally, at step 1008, the thermal cage can be connected to a controller, which can be utilized to adjust environmental conditions affecting the electronic equipment. The controller can be configured to adjust the pressure, humidity, and temperature within the thermal cage and/or cabinets. Notably, the controller can be adapted to monitor the environmental conditions affecting the electronic equipment. The controller can monitor the conditions existing in the thermal cage at step 1010. Monitoring can be performed by receiving measurements and/or readings from various sensors placed in proximity to and/or within the thermal cage. In an embodiment, the controller can include sensors as well. The sensors, for example, can include temperature, humidity, pressure, or other types of sensors.

Measurement data can be transmitted to the controller through wireless communications, wired communications, or through other means. Upon receiving the measurement data from the sensors, the controller can compare the measurement data to acceptable measurement ranges for the electronic equipment. If the measurement data is found to be outside the range of acceptable measurement ranges, the controller can adjust the environmental conditions existing inside the thermal cage so that the conditions eventually fall within the measurement ranges. However, if the measurement data is found to be within the range of acceptable measurement ranges, the controller can continue to keep the environmental conditions at their current levels or adjust the conditions so that they can be optimized.

In an embodiment, the controller can adjust or transmit a signal to adjust the positions of one or more barriers of the thermal curtain so as to regulate the environmental conditions in one or more of the cabinets. For example, the controller can actuate the barriers of the thermal curtain so as to cause the barriers to rotate into a desired position and/or adjust a length or width of the barriers. Adjusting the positions and/or length of the barriers can be utilized to allow different temperatures at different rows of the cabinets. Furthermore, rotating and adjusting the barriers of the curtain can be utilized to cause a temperature gradient between cabinets and/or rows of the cabinets. In one embodiment, the controller can transmit a signal to a technician to adjust a position and/or length of the barriers. The technician can then rotate and/or adjust the length of the barriers of the thermal curtain via a hook and swivel mechanism or other similar structure.

At step 1012, the thermal cage can be connected to one or more of a communications network, a chiller, and/or a power source of the facility. For instance, the thermal cage can be connected to a cable network, wireless network, satellite network, interactive communications network, tier 1 telecommunications networks, and other networks. The chiller can be utilized to chill water or other fluid which can be utilized by the cooling coil to cool air. The cooling coil can cool the air and the raised floor system can be utilized to channel the cooled air through an inlet of a cabinet so as to cool the electronic equipment to the desired temperature range. Power sources can include electrical outlets, generators, battery systems, or other similar means for providing power to the thermal cage and any electronic equipment within the thermal cage. In an embodiment, the thermal cage can also be connected to mantraps, biometric devices, and surveillance systems, which can be utilized to prevent unauthorized users from accessing or tampering with the equipment.

At step 1014, the thermal cage can be disconnected from the drop ceiling grid and/or the raised floor system. Additionally, the thermal cage can also be disconnected from any of the other components described above as well. The thermal cage can then be transported so as to be used in a different location at step 1016. Once the thermal cage is in a different location, the thermal cage can be connected to a different drop ceiling grid, raised floor system, chiller, power source, controller, biometric devices, mantraps, surveillance systems, or any other component described above. Notably, the method 1000 can also include all of the operative features in the systems described above and is not intended to be limited to the description and drawings contained herein.

Upon reviewing the aforementioned embodiments, it would be evident to an artisan with ordinary skill in the art that said embodiments can be modified, reduced, or enhanced without departing from the scope and spirit of the claims described below.

The methodology and techniques described with respect to the exemplary embodiments can be performed using a machine or other computing device within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment. The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The machine may include a processor (e.g., a central processing unit (CPU), a graphics processing unit (GPU, or both), a main memory and a static memory, which communicate with each other via a bus. The machine may further include a video display unit (e.g., a liquid crystal display (LCD), a flat panel, a solid state display, or a cathode ray tube (CRT)). The machine may include an input device (e.g., a keyboard), a cursor control device (e.g., a mouse), a disk drive unit, a signal generation device (e.g., a speaker or remote control) and a network interface device.

The disk drive unit may include a machine-readable medium on which is stored one or more sets of instructions (e.g., software) embodying any one or more of the methodologies or functions described herein, including those methods illustrated above. The instructions may also reside, completely or at least partially, within the main memory, the static memory, and/or within the processor during execution thereof by the machine. The main memory and the processor also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions, or that which receives and executes instructions from a propagated signal so that a device connected to a network environment can send or receive voice, video or data, and to communicate over the network using the instructions. The instructions may further be transmitted or received over a network via the network interface device.

While the machine-readable medium is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of arrangements described herein are intended to provide a general understanding of the structure of various embodiments, and they are not intended to serve as a complete description of all the elements and features of apparatus and systems that might make use of the structures described herein. Many other arrangements will be apparent to those of skill in the art upon reviewing the above description. Other arrangements may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific arrangements have been illustrated and described herein, it should be appreciated that any arrangement calculated to achieve the same purpose may be substituted for the specific arrangement shown. This disclosure is intended to cover any and all adaptations or variations of various embodiments and arrangements of the invention. Combinations of the above arrangements, and other arrangements not specifically described herein, will be apparent to those of skill in the art upon reviewing the above description. Therefore, it is intended that the disclosure not be limited to the particular arrangement(s) disclosed as the best mode contemplated for carrying out this invention, but that the invention will include all embodiments and arrangements falling within the scope of the appended claims.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims.

What is claimed is:

1. A method comprising:
providing a movable thermal cage for managing environmental conditions affecting electronic equipment, wherein the movable thermal cage comprises a housing, a first row of cabinets containing a first portion of the electronic equipment and a second row of cabinets containing a second portion of the electronic equipment and separated from the first row of cabinets by a first space, and a thermal curtain, wherein the housing forms a first enclosure for the first and second rows of cabinets and the first and second rows of cabinets form second enclosures for the electronic equipment, and wherein the thermal curtain comprises a first rail extending generally horizontally across the first space between the first and second rows of cabinets and a first set of adjustable barriers extending from the first rail between the first and second rows of cabinets into the first space and configured to direct air flowing through the first and second rows of cabinets to a plenum;
providing temperature-regulated air to the first and second rows of cabinets; and
connecting the movable thermal cage to at least one of a drop ceiling grid and a raised floor system,
wherein the adjustable barriers in the first set are positioned adjacent to one another on the first rail horizontally across the first space, and wherein each of the adjustable barriers individually extends in a vertical orientation and has a first swivel position such that the adjustable barriers cooperate to collectively block flow of the temperature-regulated air and a second swivel position such that gaps between adjacent adjustable barriers allow the flow of the temperature-regulated air to pass between the adjacent adjustable barriers, wherein the second swivel position is oriented at 90° relative to the first swivel position about a vertical axis of swivel.

2. The method of claim 1, further comprising connecting the movable thermal cage to a controller of a facility for adjusting environmental conditions affecting the electronic equipment, wherein the controller is adapted to receive data from at least one sensor positioned within the movable thermal cage, and wherein the data comprises at least one of temperature, pressure, and humidity data, and wherein the controller is configured to adjust the first set of adjustable barriers between the first and second swivel positions based on the at least one of temperature, pressure, and humidity data.

3. The method of claim 2, further comprising:
connecting the movable thermal cage to at least one of a communications network, a chiller, and a power source of the facility.

4. The method of claim 1, wherein the movable thermal cage is connectable to a communications network.

5. The method of claim 1, wherein the movable thermal cage is connectable to a chiller, wherein water provided to a cooling coil for cooling the air is chilled by the chiller.

6. The method of claim 1, wherein the movable thermal cage is connectable to one or more power sources, wherein power is provided by the power sources to the electronic equipment.

7. The method of claim 1, wherein the movable thermal cage comprises the drop ceiling grid, wherein the first set of adjustable barriers of the thermal curtain are connectable to the drop ceiling grid by way of a hook and a swivel mechanism.

8. The method of claim 7, wherein the first set of adjustable barriers are adjustable by actuating the swivel mechanism.

9. The method of claim 1, wherein the housing of the movable thermal cage defines an access door configured to provide an authorized user access into the thermal cage.

10. The method of claim 1, wherein the connecting step includes connecting the movable thermal cage to the drop ceiling grid and the raised floor system.

11. The method of claim 1, further comprising disconnecting the movable thermal cage from the at least one of the drop ceiling grid and the raised floor system, and moving the movable thermal cage to another location.

12. The method of claim 11, wherein the housing of the movable thermal cage includes roller mechanisms in contact with the raised floor system and configured to roll the movable thermal cage across the raised floor system.

13. The method of claim 2, further comprising adjusting the flow of the temperature-regulated air by collectively rotating each of the adjustable barriers in dependence on the temperature data.

14. The method of claim 1, wherein the thermal curtain further comprises a second rail extending generally horizontally across the first space between the first and second rows of cabinets at a different position than the first rail and a second set of adjustable barriers extending from the second rail and also configured to direct the air flowing through the cabinets to the plenum.

15. The method of claim 14, wherein the first set of adjustable barriers and the second set of adjustable barriers are independently adjustable.

16. The method of claim 1, wherein each of the first set of adjustable barriers is flexible.

17. The method of claim 14, wherein the thermal curtain further comprises at least two additional rails, each extending generally horizontally across the first space between the first and second rows of cabinets at different positions than the first and second rails; and at least two additional sets of adjustable barriers, each of the additional sets respectively extending one of the at least two additional rails and also configured to direct the air flowing through the cabinets to the plenum.

18. The method of claim 7, wherein the hook and swivel mechanism is coupled to the first rail with a hook and a tension bar.

19. A method comprising:
- providing a thermal cage for managing environmental conditions affecting electronic equipment, wherein the thermal cage comprises
  - a housing,
  - a first row of cabinets containing a first portion of the electronic equipment and a second row of cabinets containing a second portion of the electronic equipment and separated from the first row of cabinets by a first space,
  - a thermal curtain, wherein the housing forms a first enclosure for the first and second rows of cabinets and the first and second rows of cabinets form second enclosures for the electronic equipment, and wherein the thermal curtain comprises a first set of adjustable barriers extending generally horizontally across the first space between the first and second rows of cabinets and configured to direct air flowing through the cabinets to a plenum,
  - a raised floor system positioned within the housing and supporting the first and second rows of cabinets,
  - a drop ceiling grid enclosed by the housing over the first and second rows of cabinets;
- providing temperature-regulated air to the first and second rows of cabinets from a cooling arrangement within the raised floor system; and
- adjusting the adjustable barriers of the first set of adjustable barriers based on the environmental conditions within the housing.

20. The method of claim 18, wherein the housing of the thermal cage includes roller mechanisms configured to transport the thermal cage.

* * * * *